United States Patent
Fujiwara et al.

(10) Patent No.: US 11,677,380 B2
(45) Date of Patent: Jun. 13, 2023

(54) SUPPRESSION OF TRANSVERSE MODE SPURIOUS SIGNALS IN SURFACE ACOUSTIC WAVE DEVICES UTILIZING A GAP HAMMER STRUCTURE

(71) Applicant: SKYWORKS SOLUTIONS, INC., Irvine, CA (US)

(72) Inventors: Joji Fujiwara, Suita (JP); Riho Sasaki, Osaka-Fu (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 413 days.

(21) Appl. No.: 17/001,826

(22) Filed: Aug. 25, 2020

(65) Prior Publication Data

US 2021/0067136 A1    Mar. 4, 2021

Related U.S. Application Data

(60) Provisional application No. 62/893,388, filed on Aug. 29, 2019.

(51) Int. Cl.
    *H03H 9/145*    (2006.01)
    *H03H 9/64*     (2006.01)
    *H03H 9/25*     (2006.01)

(52) U.S. Cl.
    CPC .......... *H03H 9/14538* (2013.01); *H03H 9/25* (2013.01); *H03H 9/6483* (2013.01); *H03H 9/6489* (2013.01)

(58) Field of Classification Search
    CPC .... H03H 9/14538; H03H 9/25; H03H 9/6483; H03H 9/6489
    See application file for complete search history.

(56) References Cited

U.S. PATENT DOCUMENTS

| | | | |
|---|---|---|---|
| 2011/0068655 A1* | 3/2011 | Solal | H03H 9/1457 310/313 B |
| 2013/0051588 A1* | 2/2013 | Ruile | H03H 9/02858 29/25.35 |
| 2021/0313961 A1* | 10/2021 | Huck | H03H 9/02992 |

* cited by examiner

*Primary Examiner* — Samuel S Outten
(74) *Attorney, Agent, or Firm* — Lando & Anastasi, LLP

(57) ABSTRACT

An acoustic wave device comprises a substrate including a piezoelectric material, and interdigital transducer (IDT) electrodes disposed on a surface of the substrate. The IDT electrodes have gap regions, edge regions, and center regions. A maximum width of the IDT electrodes in the gap regions is greater than the maximum width of the IDT electrodes in the edge regions, thereby achieving a velocity of an acoustic wave in the gap regions being greater than the velocity of the acoustic wave in the center regions, and the velocity of the acoustic wave in the center regions being greater than the velocity of the acoustic wave in the edge regions.

18 Claims, 22 Drawing Sheets

SUPPRESSION OF TRANSVERSE MODE SPURIOUS SIGNALS IN SURFACE ACOUSTIC WAVE DEVICES UTILIZING A GAP HAMMER STRUCTURE

CROSS-REFERENCE TO RELATED APPLICATIONS

This application claims priority under 35 U.S.C. § 119(e) to U.S. Provisional Patent Application No. 62/893,388, titled SUPPRESSION OF TRANSVERSE MODE SPURIOUS SIGNALS IN SURFACE ACOUSTIC WAVE DEVICES UTILIZING A GAP HAMMER STRUCTURE, filed Aug. 29, 2019, the content of which being incorporated herein in its entirety for all purposes.

BACKGROUND

Technical Field

Embodiments of this disclosure relate to acoustic wave devices and to suppression of transverse mode spurious signals in same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front-end of a mobile phone can include acoustic wave filters. Two acoustic wave filters can be arranged as a duplexer.

SUMMARY

In accordance with an aspect, there is provided an acoustic wave device. The acoustic wave device comprises a substrate including a piezoelectric material, and interdigital transducer (IDT) electrodes disposed on a surface of the substrate, the IDT electrodes having gap regions, edge regions, and center regions, a maximum width of the IDT electrodes in the gap regions being greater than the maximum width of the IDT electrodes in the edge regions, to cause a velocity of an acoustic wave in the gap regions to be greater than the velocity of the acoustic wave in the center regions, and the velocity of the acoustic wave in the center regions to be greater than the velocity of the acoustic wave in the edge regions.

In some embodiments, an average width of the IDT electrodes in the gap region is greater than the average width of the IDT electrodes in the edge regions. The average width of the IDT electrodes in the gap region may be greater than the average width of the IDT electrodes in the center regions.

In some embodiments, the acoustic wave device further comprises IDT electrode extensions extending from the IDT electrodes in a widthwise direction from the IDT electrodes in the gap regions. The IDT electrode extensions may extend partially into extending regions of IDT electrodes adjacent to the IDT electrodes from which the IDT electrode extensions extend. The IDT electrode extensions may extend fully into extending regions of the IDT electrodes adjacent to the IDT electrodes from which the IDT electrode extensions extend. The IDT electrode extensions may extend beyond extending regions of the IDT electrodes adjacent to the IDT electrodes from which the IDT electrode extensions extend.

In some embodiments, a distance between the IDT electrode extensions and tips of IDT electrodes adjacent to the IDT electrodes from which the IDT electrode extensions extend is less than widths of the IDT electrodes in the edge regions.

In some embodiments, a distance between the IDT electrode extensions and tips of IDT electrodes adjacent to the IDT electrodes from which the IDT electrode extensions extend is less than widths of the IDT electrodes in the center regions.

In some embodiments, widths of the IDT electrode extensions in a direction perpendicular to a propagation direction of a main acoustic wave through the device is less than widths of the IDT electrodes in the edge regions.

In some embodiments, widths of the IDT electrode extensions in a direction perpendicular to a propagation direction of a main acoustic wave through the device is less than widths of the IDT electrodes in the center regions.

In some embodiments, widths of portions of the IDT electrodes in the gap regions are different from widths of the IDT electrodes in the edge regions.

In some embodiments, widths of the portions of the IDT electrodes in the gap regions are greater than widths of the IDT electrodes in the edge regions.

In some embodiments, widths of the portions of the IDT electrodes in the gap regions are less than widths of the IDT electrodes in the edge regions.

In some embodiments, widths of portions of the IDT electrodes in the gap regions are different from widths of the IDT electrodes in the center regions.

In some embodiments, widths of the portions of the IDT electrodes in the gap regions are greater than widths of the IDT electrodes in the center regions.

In some embodiments, widths of the portions of the IDT electrodes in the gap regions are less than widths of the IDT electrodes in the center regions.

In some embodiments, widths of the IDT electrodes in the edge regions are greater than widths of the IDT electrodes in the center regions.

In some embodiments, the acoustic wave device further comprises a first dielectric film having a lower surface disposed on the IDT electrodes and the surface of the substrate. The acoustic wave device may further comprise a second dielectric film having an acoustic velocity greater than an acoustic velocity of the first dielectric film disposed on an upper surface of the first dielectric film.

In some embodiments, the second dielectric film has a thickness in the center regions greater than a thickness of the second dielectric film in the edge regions and in the gap regions.

In some embodiments, widths of the IDT electrodes in the edge regions are greater than widths of the IDT electrodes in the center regions.

In some embodiments, the second dielectric film has a thickness in the center regions and first portions of the edge regions greater than a thickness of the second dielectric film in second portions of the edge regions and in the gap regions.

In some embodiments, each of a plurality of the IDT electrodes includes a portion in an outer side of one of the gap regions that has a central axis that is offset in a direction parallel to a propagation direction of a main acoustic wave through the resonator from a central axis of a portion of the IDT electrode in an inner side of the one of the gap regions. The central axis of the portion of each of the plurality of the IDT electrodes in the outer side of the one of the gap regions may be offset in the direction parallel to the propagation direction of the main acoustic wave through the resonator from a central axis of a portion of the IDT electrode in a center region of the resonator.

In some embodiments, the central axis of the portion of each of the plurality of the IDT electrodes in the outer side of the one of the gap regions is offset in the direction parallel to the propagation direction of the main acoustic wave through the resonator from a central axis of an adjacent IDT electrode.

In some embodiments, the IDT electrodes include a layer of tungsten.

In accordance with another aspect, there is provided a radio frequency filter. The radio frequency filter comprises at least one acoustic wave device, the at least one acoustic wave device including a substrate including a piezoelectric material, and interdigital transducer (IDT) electrodes disposed on a surface of the substrate, the IDT electrodes having gap regions, edge regions, and center regions, a velocity of an acoustic wave in the gap regions being greater than the velocity of the acoustic wave in the center regions, the velocity of the acoustic wave in the center regions being greater than the velocity of the acoustic wave in the edge regions.

In accordance with another aspect, there is provided an electronics module. The electronics module comprises at least one radio frequency filter including at least one acoustic wave device, the at least one acoustic wave device including a substrate including a piezoelectric material, and interdigital transducer (IDT) electrodes disposed on a surface of the substrate, the IDT electrodes having gap regions, edge regions, and center regions, a velocity of an acoustic wave in the gap regions being greater than the velocity of the acoustic wave in the center regions, the velocity of the acoustic wave in the center regions being greater than the velocity of the acoustic wave in the edge regions.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
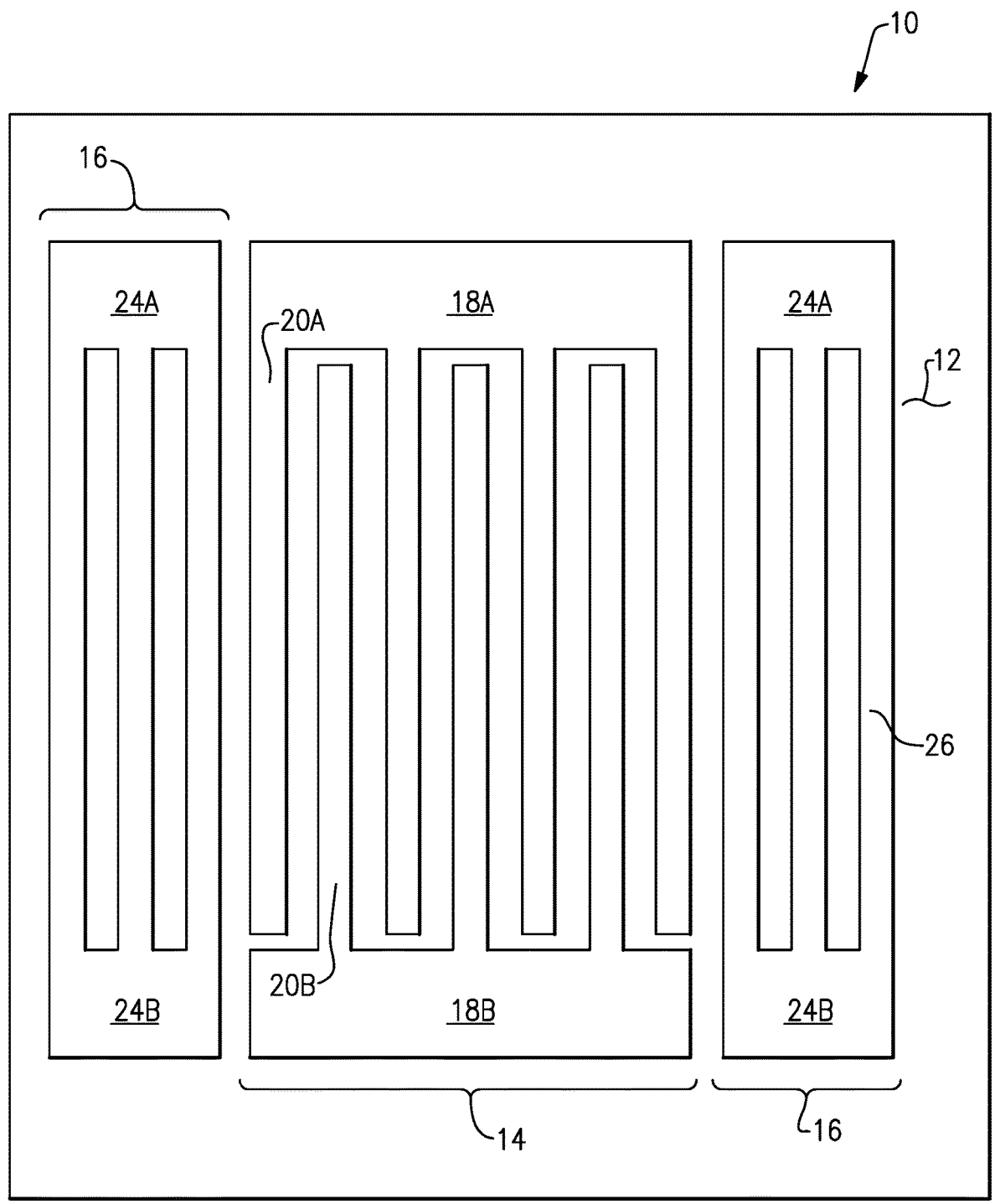
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on a piezoelectric substrate, for example, a lithium tantalate ($LiTaO_3$) or lithium niobate ($LiNbO_3$) substrate 12 and includes Interdigital Transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrode 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrode 24) and reflector fingers 26 extending between and electrically coupling the first bus bar electrode 24A and the second bus bar electrode 24B.

Figure 1B:
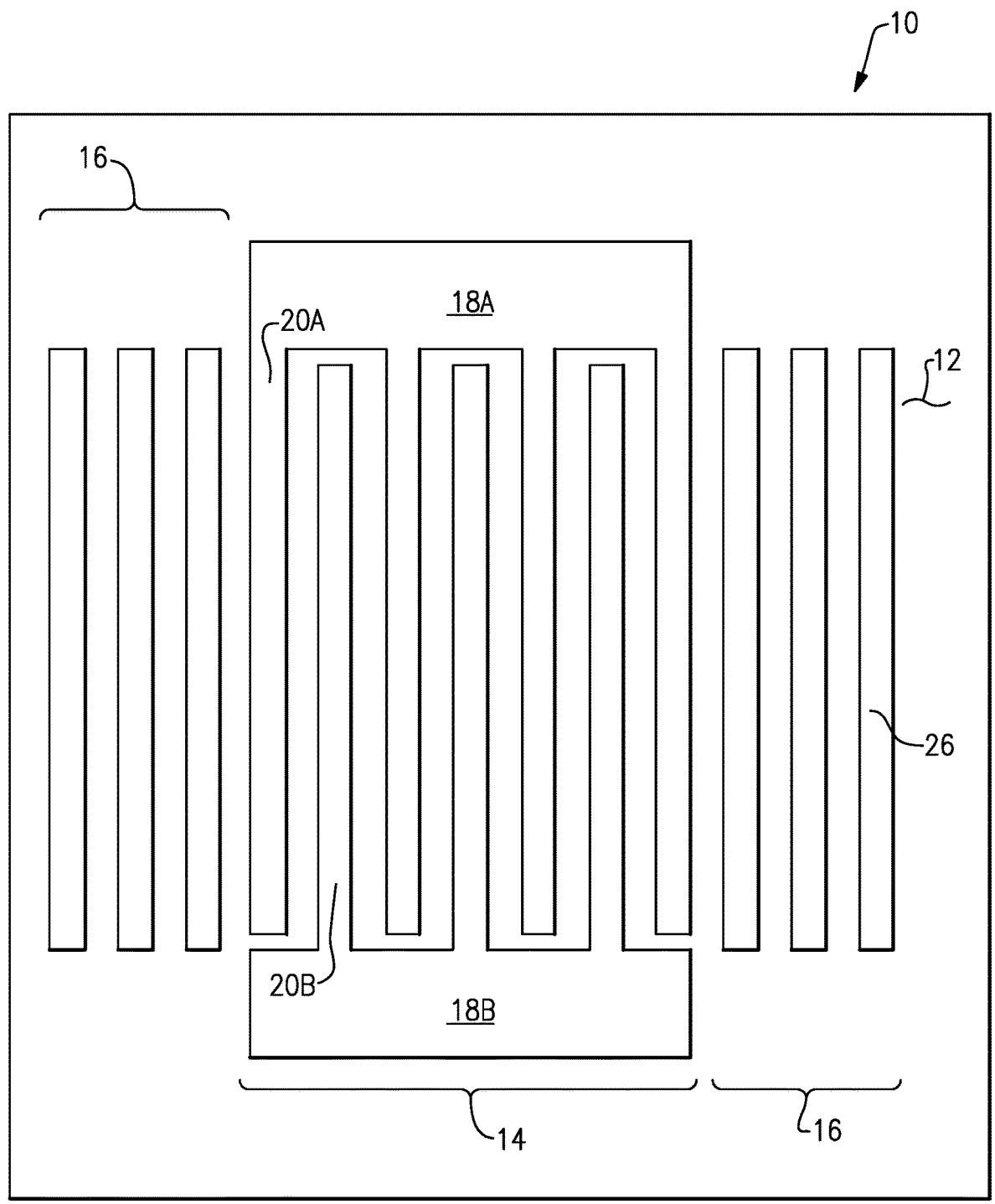
FIG. 1B is a simplified plan view of another example of a surface acoustic wave resonator.
Figure 1C:
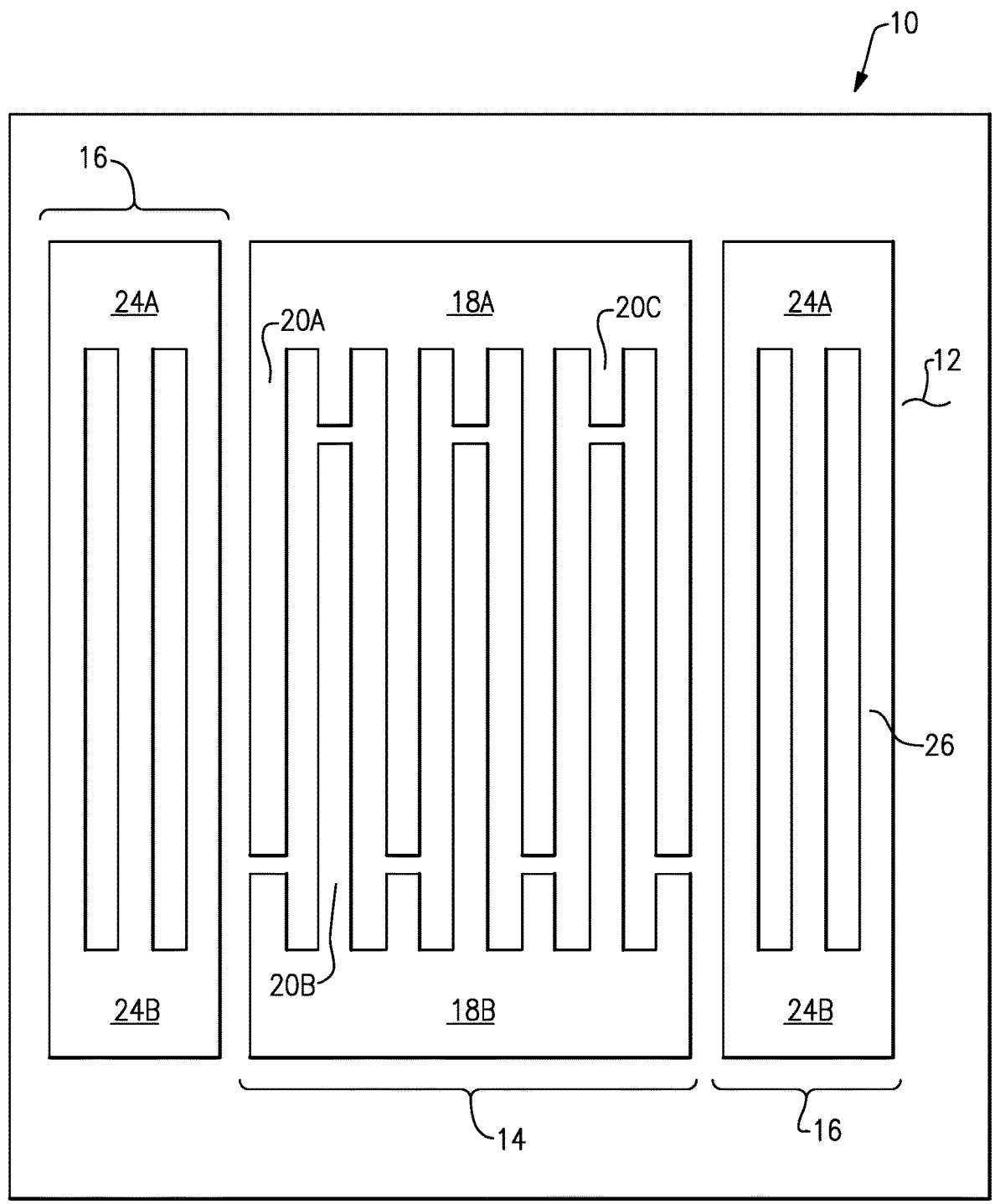
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

It should be appreciated that the acoustic wave resonators 10 illustrated in FIGS. 1A-1C, as well as the other circuit elements illustrated in other figures presented herein, is are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes sandwiched between the reflector electrodes.

Figure 2A:
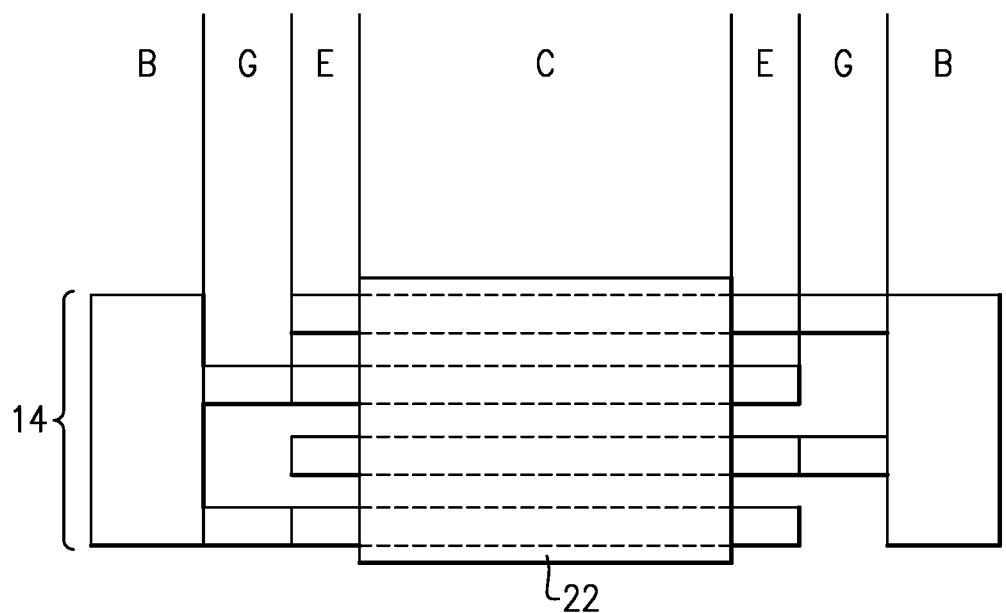
FIG. 2A is a plan view of a portion of electrodes of a surface acoustic wave filter including a structure for suppressing transverse mode spurious signals.
Figure 2B:
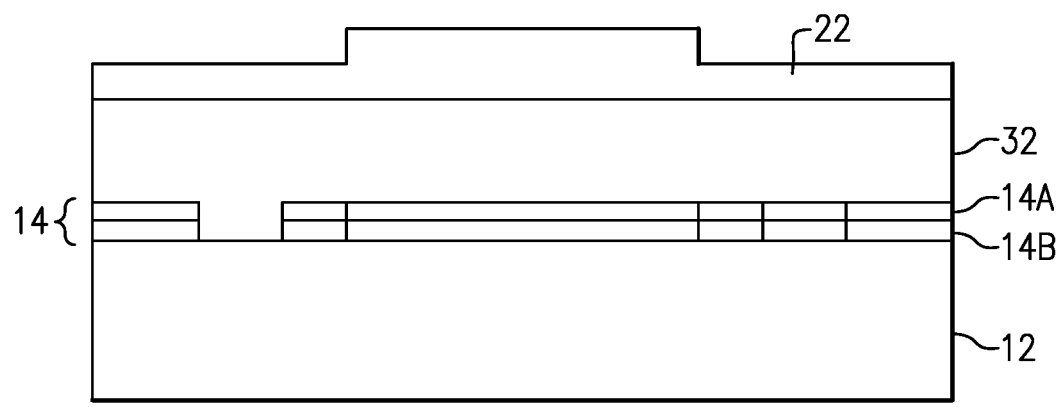
FIG. 2B is a cross-sectional view of a portion of electrodes of a surface acoustic wave resonator including a structure for suppressing transverse mode spurious signals.
Figure 4:
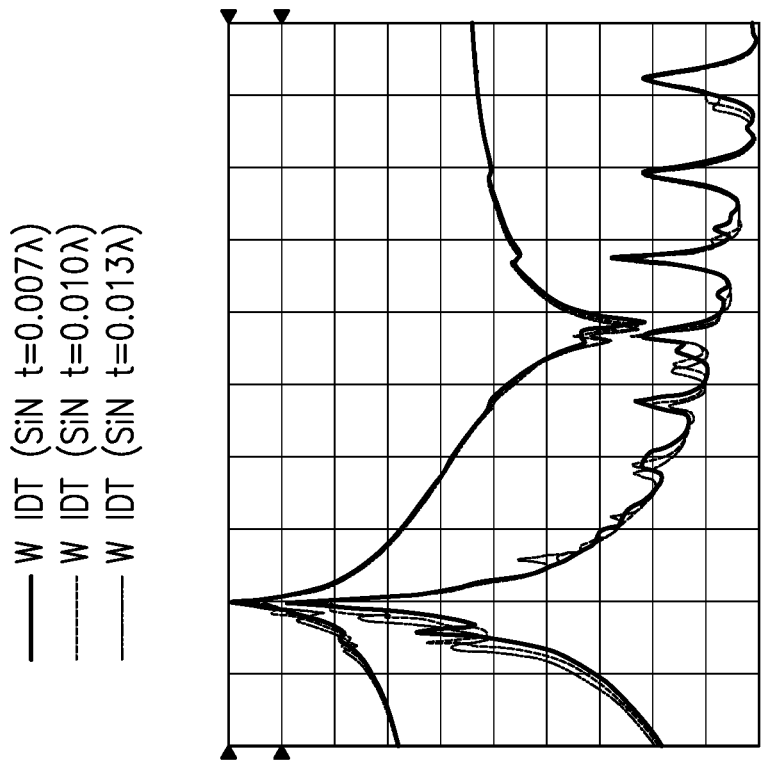
FIG. 4 illustrates transverse spurious mode signals generated in a SAW resonator including IDT electrodes with a tungsten layer.

As illustrated in FIG. 2A, regions along lengths of the IDT electrodes of a SAW device, e.g., a SAW resonator, may be characterized as busbar regions "B" including the busbar portions of the IDT electrodes, gap regions "G" between the busbar of a first set of IDT electrodes and the ends of the fingers of a second set of IDT electrode extending from a second busbar of the SAW device, edge regions "E" including end portions of the IDT electrodes, and a center region "C" sandwiched between the edge regions. In some embodiments, the gap regions may have widths of between about 1λ and 1.5λ, the edge regions may have widths of between about 0.25λ and 1.25λ, and the center region may have a width of about 20λ, although it should be understood that these dimensions are only examples and may vary based on the design of a particular resonator. In some embodiments, a layer of a dielectric 22 exhibiting a high acoustic wave velocity, for example, silicon nitride ($Si_3N_4$, also abbreviated as "SiN" herein) may be disposed over the IDT electrodes within the center region C. In some embodiments, as illustrated in FIG. 2B, the layer of high acoustic wave velocity material 22 may be deposited over a dielectric material 32 having a lower acoustic wave velocity, for example, silicon dioxide ($SiO_2$) disposed over the entire IDT electrode structure (regions B, G, E, and D). The layer of high acoustic wave velocity material 22 may include a thicker portion disposed in the center region C than in the other regions B, G, and E. The layer of high acoustic wave velocity material 22 disposed over the IDT electrodes in the center region C may help to confine acoustic waves to the center region C and reduce the amount of acoustic energy that travels outside of this region in a direction perpendicular to that of the propagation direction of the main acoustic wave in the device and that may cause transverse mode spurious signals in the frequency response of the SAW device. The main acoustic wave of the device travels perpendicular to the lengthwise direction of the IDT electrodes and the transverse mode spurious signals may be caused by acoustic waves travelling parallel to the lengthwise direction of the IDT electrodes.

The $SiO_2$ layer 32 may have a negative temperature coefficient of frequency, which helps to offset the positive temperature coefficient of frequency of the piezoelectric substrate 12 and reduce the change in frequency response of the SAW device with changes in temperature. A SAW device with a layer of $SiO_2$ over the IDT electrodes may thus be referred to as a temperature-compensated SAW device, or TCSAW.

As also illustrated in FIG. 2B, the IDT electrodes 14 may be layered electrodes including an upper layer 14A of a highly conductive but low-density material, for example, aluminum (Al), and a lower layer 14B of a less conductive, but more dense material, for example, molybdenum (Mo) or tungsten (W). The denser lower layer 14B may reduce the acoustic velocity of acoustic waves travelling through the device which may allow the IDT electrode fingers to be spaced more closely for a given operating frequency and allow the SAW device to be reduced in size as compared to a similar device utilizing less dense IDT electrodes. The less dense upper layer 14A may have a higher conductivity than the lower layer 14B to provide the electrode stack with a lower overall resistivity.

Consumers and device manufactures continue to demand electronic products such as cellular telephones with smaller form factors and/or that include additional functionality. Accordingly, there is a continuing demand for smaller and smaller electronic components used in these electronic products, for example, SAW resonators and filters that are incorporated in same. A method of decreasing the size of a SAW resonator while maintaining the operating frequency of the SAW resonator includes increasing the density of the IDT electrodes of the SAW resonator. Higher density IDT electrodes result in a reduced velocity and reduced wavelength of acoustic waves generated in the SAW resonator, which allows denser IDT electrodes to be spaced closer to each other than less dense IDT electrodes to achieve the same operating frequency. In many examples of previously and currently available SAW resonators, the IDT electrodes were formed of Mo, often with a layer of Al on top of the Mo to increase the conductivity of the IDT electrodes. To increase the density of the IDT electrodes, the Mo layer of the IDT electrodes may be replaced with a layer of a higher density material, for example, W.

Figure 3:
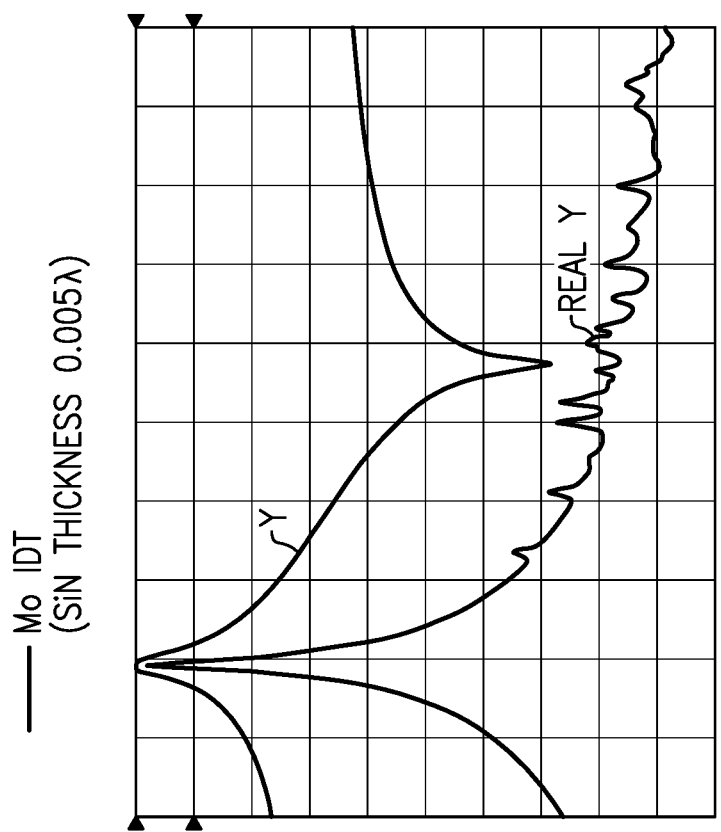
FIG. 3 illustrates transverse spurious mode signals generated in a SAW resonator including IDT electrodes with a molybdenum layer.

It has been discovered that when the Mo layer in IDT electrodes of examples of SAW resonators is replaced with W, previously utilized structures, such as the layer of high acoustic wave velocity material 22 disposed over the IDT electrodes in their center region C, may be less effective than desirable in suppressing transverse mode spurious signals that may interfere with operation of the SAW resonator. FIG. 3A illustrates the strength of transverse mode spurious signals generated in a SAW resonator utilizing IDT electrodes with a Mo layer and a silicon nitride layer thickness of 0.005λ, where λ represents the wavelength of the main acoustic wave generated in the resonator. In comparison, FIG. 3B illustrates the strength of transverse mode spurious signals generated in a similar SAW resonator utilizing IDT electrodes with a W layer and various silicon nitride layer thickness. It can be seen that even if the thickness of the silicon nitride layer is more than doubled in the SAW resonator utilizing the IDT electrodes with the W layer as compared to that of the SAW resonator utilizing the IDT electrodes with the Mo layer, the transverse mode spurious signals generated in the SAW resonator utilizing the IDT electrodes with the W layer are significantly stronger than the transverse mode spurious signals generated in the SAW resonator utilizing the IDT electrodes with the Mo layer.

Figure 5:
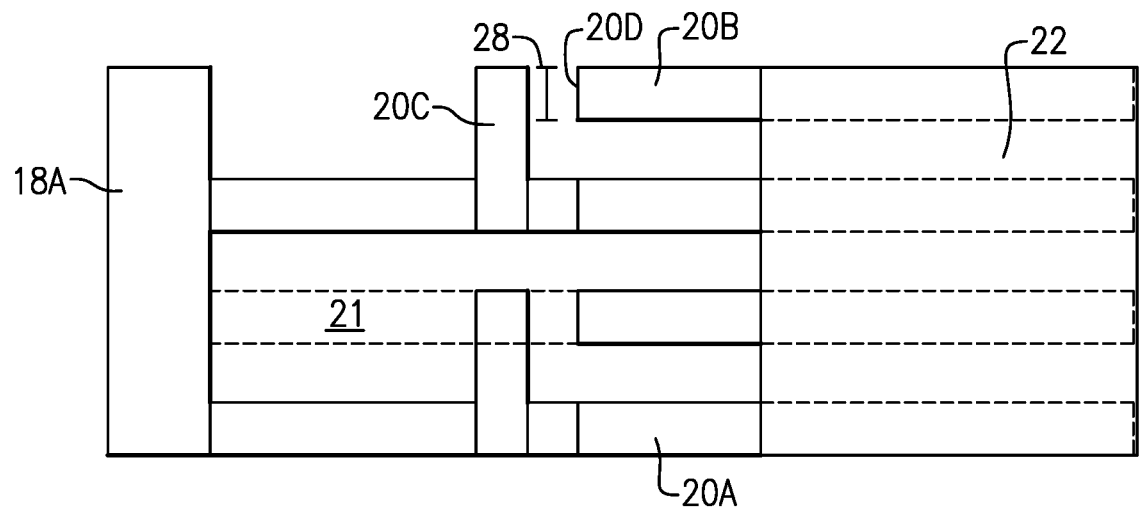
FIG. 5 illustrates an example of IDT electrode extensions in a gap region of a SAW resonator.

One method of reducing the strength of transverse mode spurious signals in a SAW resonator may be to include additional material, for example, extensions of the IDT electrodes in the gap regions of the SAW resonator. FIG. 5 illustrates one example of a SAW resonator including extensions 20C of the IDT electrodes in the gap regions of the resonator. Only the region proximate one of the busbars 18A and extensions 20C from only one set 20A of IDT electrodes is illustrated. It is to be appreciated that the same form of IDT electrode extensions 20C may be present in the gap region on the unillustrated side of the resonator extending from the second set 20B of IDT electrodes (See FIG. 6 below). The resonator may include the layer of high acoustic wave velocity material 22 over the IDT electrodes in the center region of the resonator and, in some embodiments, the layer of dielectric material 32 below the layer of material 22 as well. The IDT electrode extensions 20C may be referred to herein as "gap hammers."

The IDT electrode extensions 20C in the gap region of the resonator may be in the form of rectangles of the same material or materials that the IDT electrodes are formed of that extend perpendicular to the lengthwise direction of the IDT electrodes. In some embodiments, the IDT electrode extensions 20C from one set of IDT electrodes 20A may extend to a position overlapping an extending region 21 of tips 20D of the other set of IDT electrodes 20B to define an overlap region 28. The extending region 21 may be defined by lines extending into the gap region from opposite lengthwise sides of the other set of IDT electrodes 20B in the edge region (and on the other side of the resonator, from the sides of the set of IDT electrodes 20A in the edge region).

In some embodiments, the IDT electrode extensions 20C may extend through and terminate at ends of the extending regions 21 and overlap an entirety of the widths of the tips 20D of the other set of IDT electrodes 20B, in other embodiments, may extend only partially through the extending regions 21 and only partially overlap the widths of the tips 20D of the other set of IDT electrodes 20B, and in other embodiments, the IDT electrode extensions 20C may extend beyond the edges of the extension regions 21 and beyond the tips 20D of the other set of IDT electrodes 20B. Unless specified otherwise, as the term is used herein, a width direction is in a direction parallel to the direction of propagation of the main acoustic wave through the SAW resonator. Unless specified otherwise, as the term is used herein, a lengthwise direction is perpendicular to the direction of propagation of the main acoustic wave through the SAW resonator.

Although illustrated as rectangular structures extending from only a single side of the IDT electrodes 20A in FIG. 5, in other embodiments, the IDT electrode extensions 20C may extend from both sides of the IDT electrodes 20A (and/or IDT electrodes 20B). It should be appreciated that the IDT electrode extensions 20C are not limited to having a rectangular shape. In other embodiments, the IDT electrode extensions 20C may be square, oval, circular, or may have any other shape desired.

Figure 6:
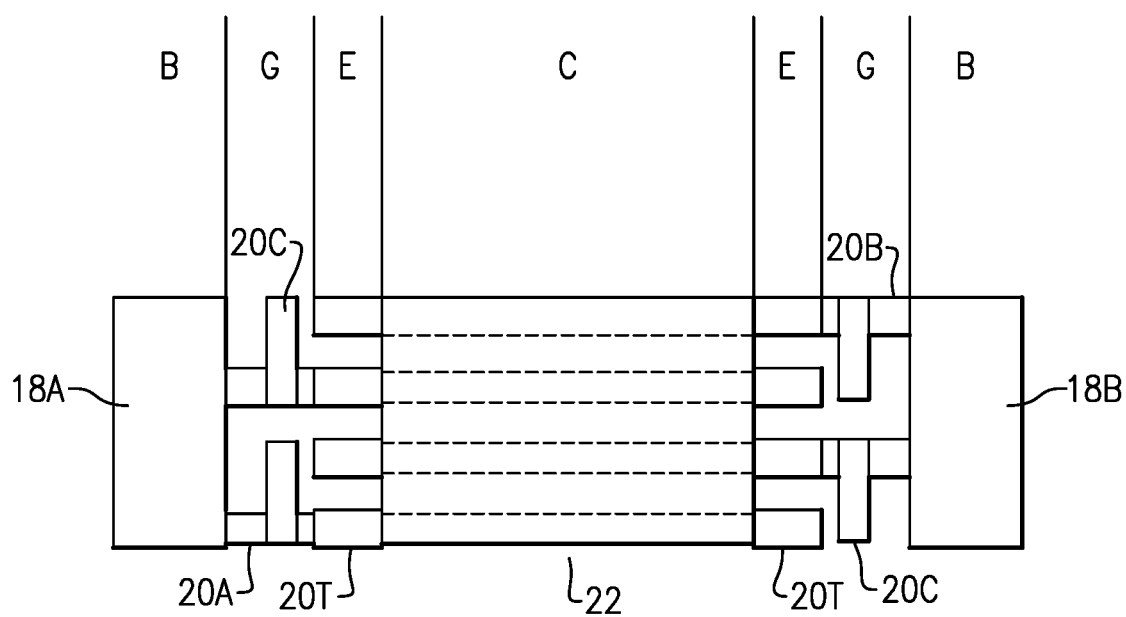
FIG. 6 illustrates an example of a SAW resonator including IDT electrode extensions in a gap region and IDT electrodes with thickened portions in an edge region.

In some embodiments, in addition to providing a SAW resonator with the IDT electrode extensions 20C as illustrated in the example shown in FIG. 5, the tip portions of the IDT electrodes 20A, 20B in the edge regions E of the resonator may be increased in width to form what may be referred to as "edge hammers." An example of a portion of a SAW resonator having IDT electrodes with tip portions 20T in the edge regions E of the resonator that are wider than portions of the IDT electrodes in the center region C of the resonator is illustrated in FIG. 6. Increasing the width of the tip portions 20T of the IDT electrodes may further suppress transverse mode spurious signals in the resonator. In some embodiments the shape and size of the enlarged IDT electrode tip portions 20T (the edge hammers) and the shape and size of the electrode extensions 20C (the gap hammers) may be sufficient to cause the SAW resonator to exhibit an acoustic velocity in the gap regions that is greater than an acoustic velocity in the center region that is, in turn, greater than an acoustic velocity in the edge regions.

Figure 7A:
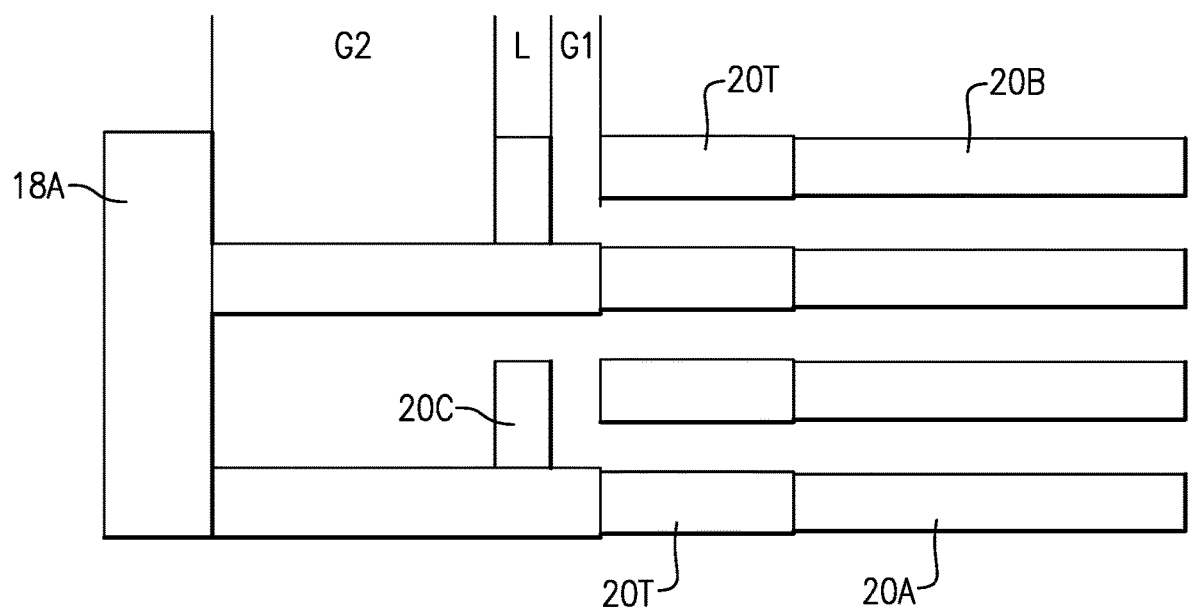
FIG. 7A illustrates an example of a SAW resonator including IDT electrode extensions in a gap region and IDT electrodes with thickened portions in an edge region and thickened portions in a gap region.
Figure 7A:
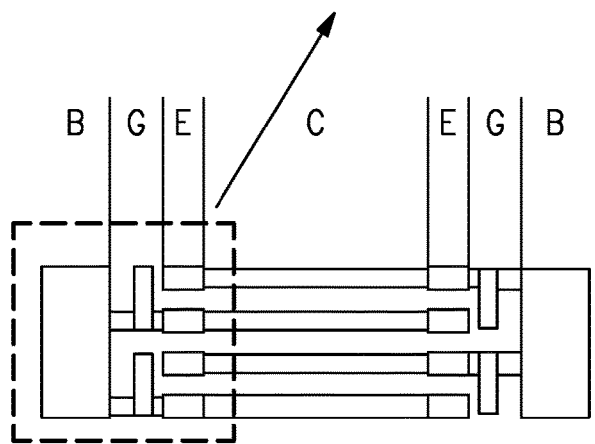

In some embodiments a gap G1 between the tips of one set of IDT electrodes 20B and the electrode extensions 20C and a gap G2 between the electrode extensions 20C and the proximate busbar 18A (see FIG. 7A) may be set such that G1 is smaller than the width of the IDT electrodes in the edge regions E and/or center region C and G2>G1. The length L of the electrode extensions 20C in the direction perpendicular to the propagation direction of the main acoustic wave in the SAW resonator may be smaller than the width of the IDT electrodes in the edge regions E and/or center region C. The width of the IDT electrodes in the gap regions G may be larger than the width of the IDT electrodes in the edge regions E and/or center region C.

Figure 7B:
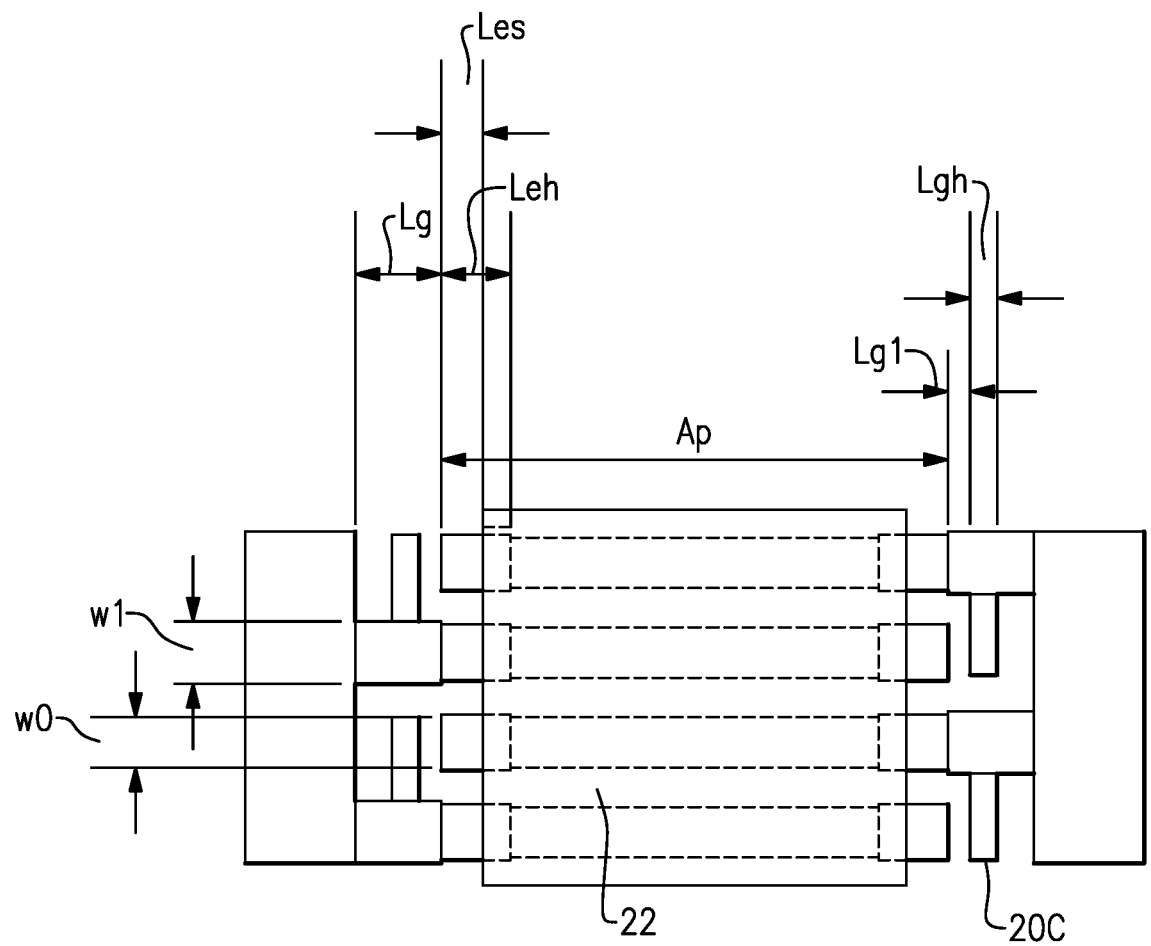
FIG. 7B defines various dimensional parameters of a SAW resonator as illustrated in FIG. 7A and including a layer of dielectric material disposed over portions of the IDT electrodes.

Various dimensional parameters of SAW resonators are defined in FIG. 7B. In FIG. 7B, w1 is the width of the bases of the IDT electrode fingers in the gap regions and w0 is the width of the tip portions of the IDT electrode fingers in the edge regions. Lg is the length between the busbar electrodes and tips of the IDT electrodes extending from the opposite bus bar electrodes. Leh is the length of the IDT electrode tip portions 20T (the edge hammers, see FIG. 6), also referred to herein as the Edge Hammer Length. Les is the length of the portions of the edge hammers over which the high acoustic wave velocity material 22 is not disposed, also referred to herein as the SiN Edge Length. Lgh is the length of the electrode extensions 20C (the gap hammers) in the lengthwise extending direction of the IDT electrodes, and is equivalent to the length L in FIG. 7A. Lg1 is the length of gap G1 of FIG. 7A between the edges of the gap hammers closest to the center region and the edge of the electrode finger in the gap region from which the gap hammers extend to the edge of the gap region closest to the center region. Ap is the length of the aperture of the SAW resonator.

Figure 8:
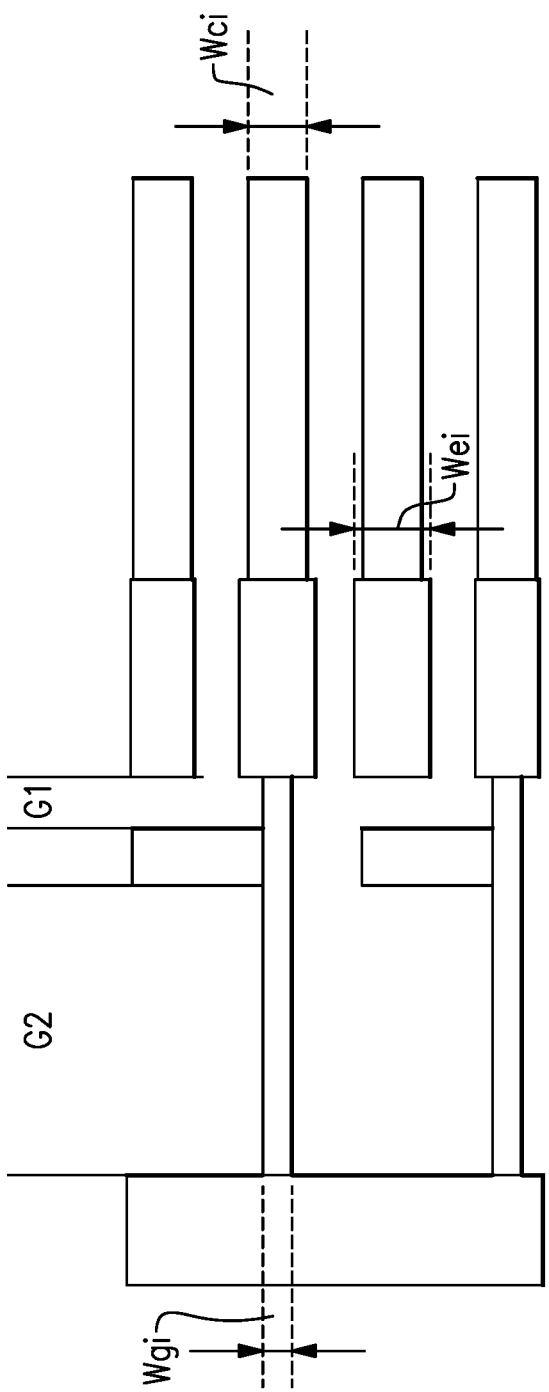
FIG. 8 illustrates a portion of an example of a SAW resonator including narrow IDT electrode portions in a gap region.
Figure 8:
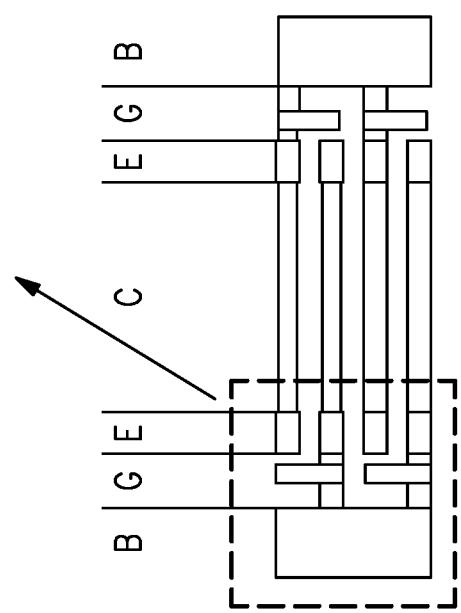

In addition to the various features described above, in some embodiments, SAW resonators as disclosed herein may include IDT electrodes having widths in the gap regions that are smaller than widths in the center regions and smaller than widths in the edge regions. An example of an embodiment including IDT electrodes with narrow portions in a gap region is illustrated in FIG. 8.

A SAW resonator including a silicon nitride layer 22 disposed on top of a silicon dioxide layer 32, that is in turn disposed on the IDT electrodes and surface of the substrate of the SAW resonator is illustrated in FIG. 2B. The silicon nitride layer includes a thick portion in the center region of the SAW resonator and thinner portions in the edge, gap, and busbar regions. In an alternate embodiment, illustrated in FIG. 9, the thinner portions of the silicon nitride layer may be omitted and the silicon nitride layer 22 may be disposed only on the silicon dioxide layer 32 in the center region.

Figure 10:
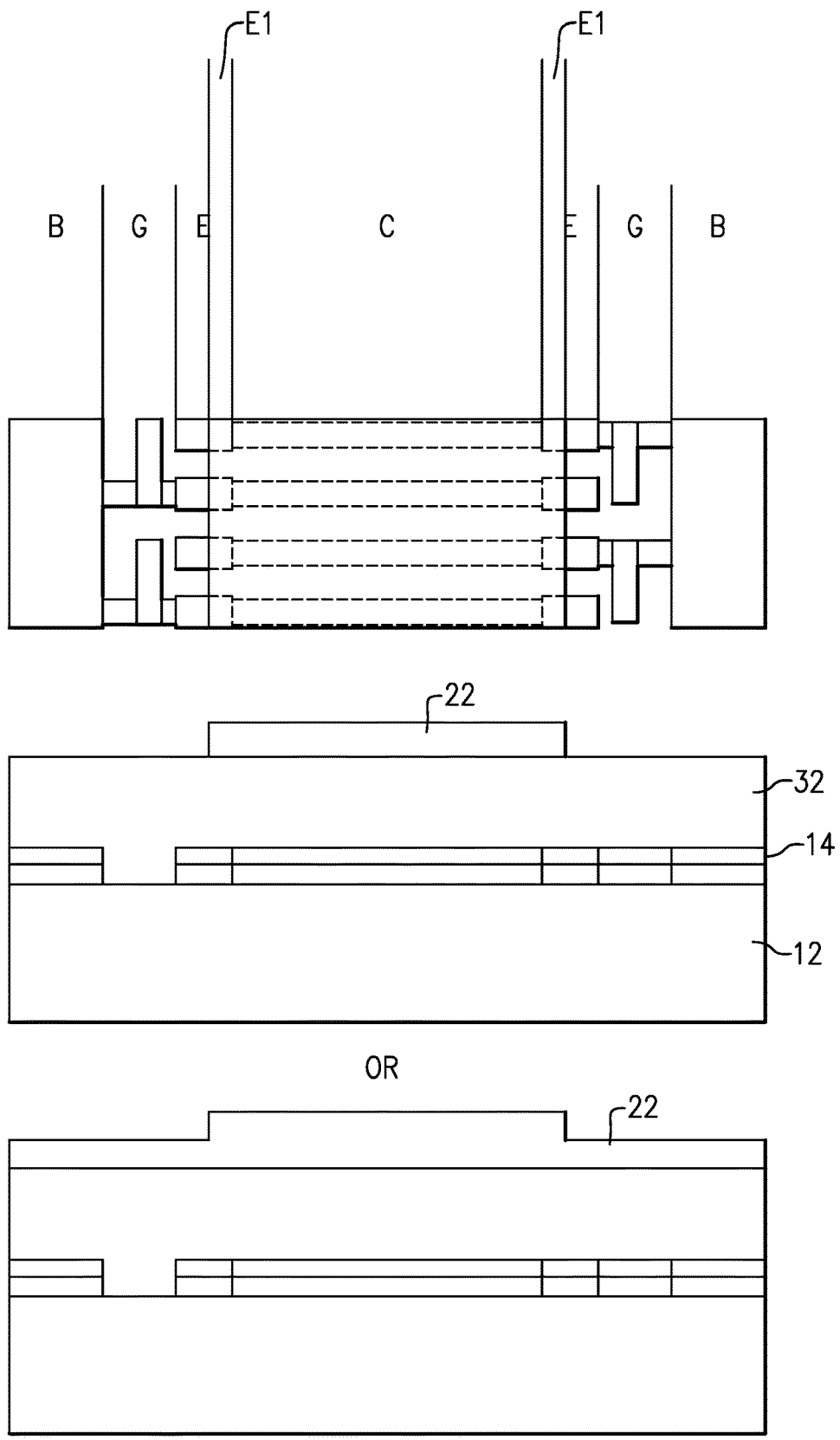
FIG. 10 illustrates an example of a SAW resonator including a dielectric material layer for suppressing transverse mode spurious signals that covers a center region of the resonator as well as portions of edge regions of the resonator.

In a further embodiment, the widthwise extent of the silicon nitride layer 22 in the direction perpendicular to the propagation direction of the main acoustic wave in the SAW resonator, or that of the thick portion of the silicon nitride layer 22 when the silicon nitride layer 22 includes both thick and thin portions, may not coincide with the boundary between the edge regions and center region of the SAW resonator. For example, as illustrated in FIG. 10, the silicon nitride layer 22 or the thick portion of the silicon nitride layer 22 may extend partially into the edge regions of the SAW resonator by a length E1. In some embodiments the length E1 is between about $0.1\lambda$ and about $0.5\lambda$. In other embodiments the silicon nitride layer 22 or the thick portion of the silicon nitride layer 22 may have edges within the center region and the silicon nitride layer 22 or the thick portion of the silicon nitride layer 22 may not extend to the boundary between the center region and edge regions of the SAW resonator.

Figure 11A:
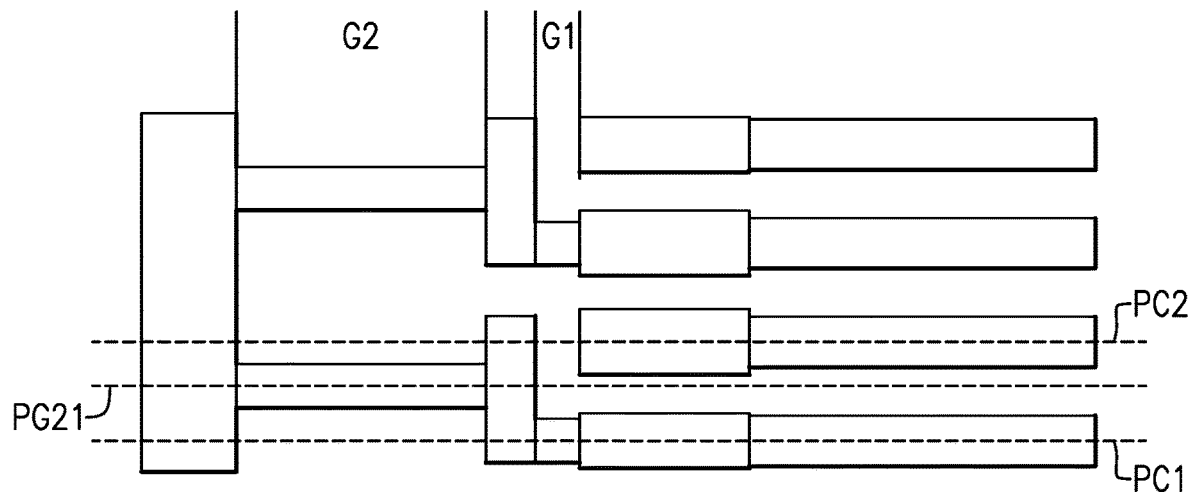
FIG. 11A illustrates an example of a SAW resonator including IDT electrode fingers having portions in the gap regions of the resonator with central axes that are offset from central axes of second portions of the same IDT electrode fingers in the gap regions and portions in the edge and central regions.
Figure 11A:
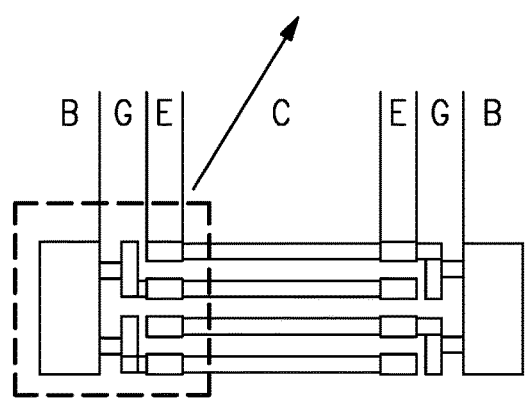
Figure 11A:
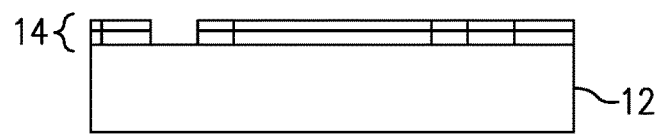

FIG. 11A illustrates another example of a SAW resonator in accordance with the present disclosure. The SAW resonator of FIG. 11A includes IDT electrode fingers having portions in the gap regions of the resonator with central axes that are offset from central axes of second portions of the same IDT electrode fingers in the gap regions and portions in the edge and central regions. As the term is used herein, a central axis of a portion of an IDT electrode finger is a line through an axis of symmetry of the portion of the IDT electrode finger in a direction perpendicular to the propagation direction of the main acoustic wave in the SAW resonator (the lengthwise direction). The central axes (PG21) of the portions of the IDT electrode fingers in the outer portion of the gap region, indicated as the G2 region in FIG. 11A, is offset in the propagation direction of the main acoustic wave in the SAW resonator (the widthwise direction) from the central axes (PC1) of the same IDT electrode fingers in the inner portion of the gap region, indicated as the G1 region in FIG. 11A, as well as portions of the same IDT electrode fingers in the edge and center regions, also indicated as axes PC1 in FIG. 11A. The central axes (PG21) of the portions of the IDT electrode fingers in the outer portion of the gap region are also offset from the central axes PC2 of adjacent IDT electrode fingers. The outer gap region G2 may be wider than the inner gap region G1. The IDT electrode fingers having the central axes PC1 and PC2 may be at different respective electrical potentials during operation.

Figure 11B:
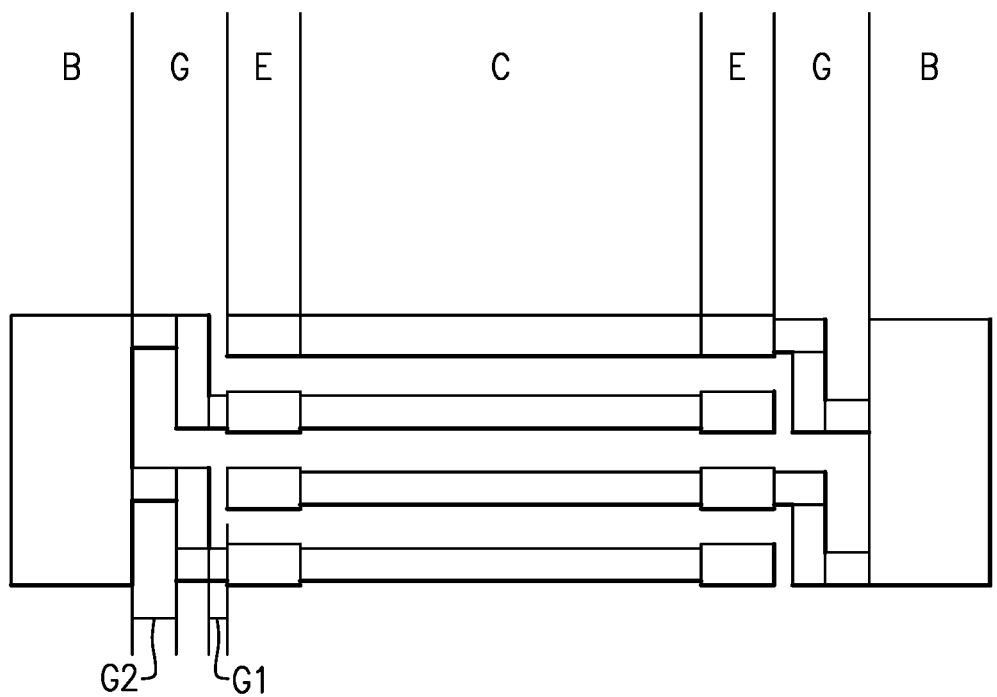
FIG. 11B illustrates an example of a SAW resonator including IDT electrode fingers having portions in the gap regions of the resonator with central axes that are aligned with central axes of adjacent IDT electrode fingers.
Figure 11C:
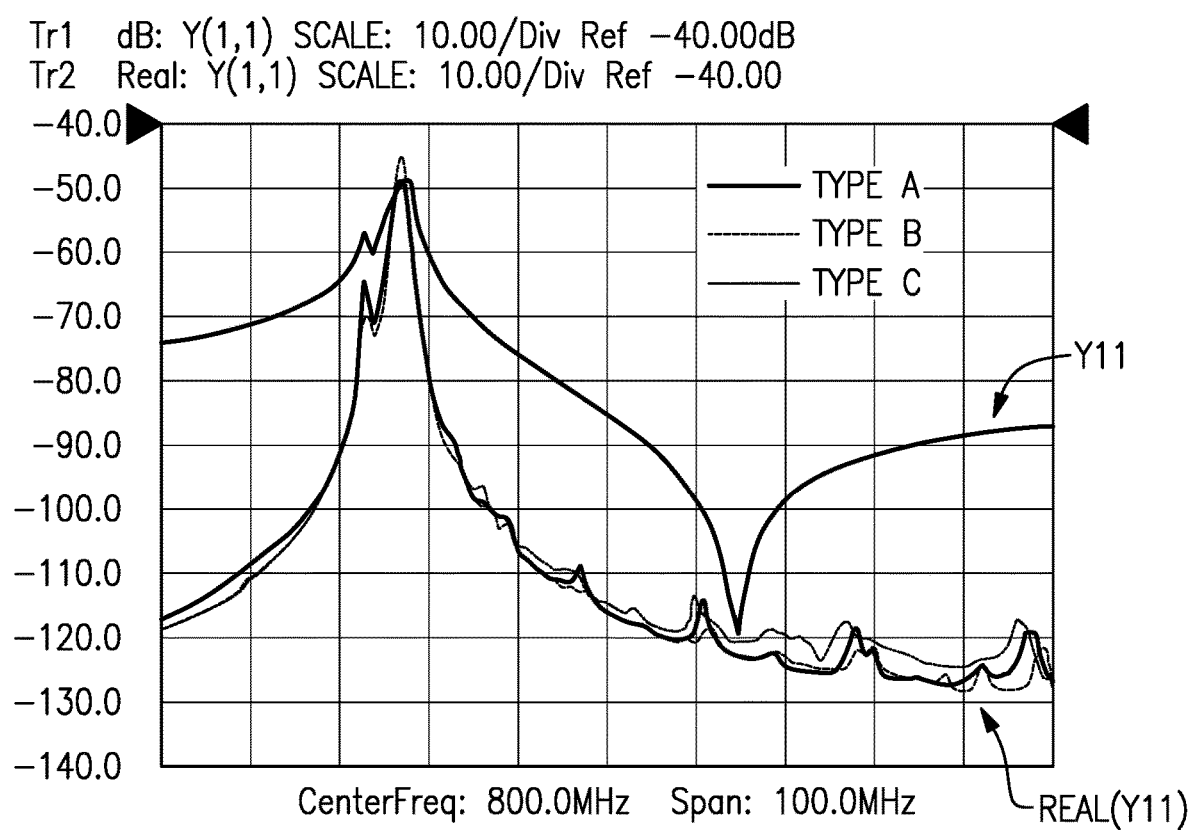
FIG. 11C illustrates a comparison between admittance curves of SAW resonators having the structures illustrated in FIGS. 6, 11A, and 11B.
Figure 11D:
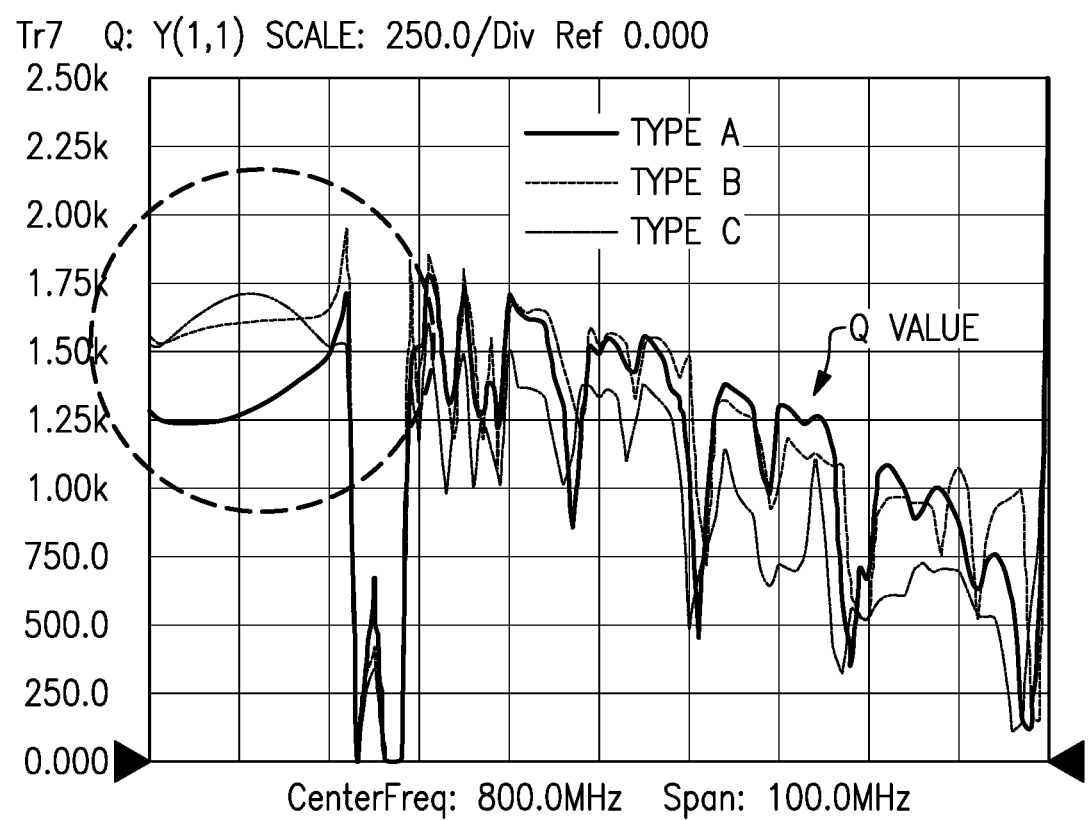
FIG. 11D illustrates a comparison between quality factor curves of SAW resonators having the structures illustrated in FIGS. 6, 11A, and 11B.

A SAW resonator having the structure illustrated in FIG. 11A may further reduce spurious signals in the admittance curve of the resonator and increase the Q value of the resonator as compared to other resonator structures. FIG. 11C presents a comparison between the admittance curves of a resonator having the structure of FIG. 6 (Type A), a resonator having the structure of FIG. 11A (Type B), and a resonator as illustrated in FIG. 11B (Type C) in which the IDT electrode fingers having portions in the gap regions with central axes that are aligned with central axes of adjacent IDT electrode fingers. FIG. 11D presents a comparison between the Q value curves of the same resonator structures. As can be observed from FIGS. 11C and 11D, the resonator structure of FIG. 11A exhibits reduced spurious mode signals and an improved Q value curve near the resonance frequency of the resonators as compared to the other two resonator structures.

Figure 12:
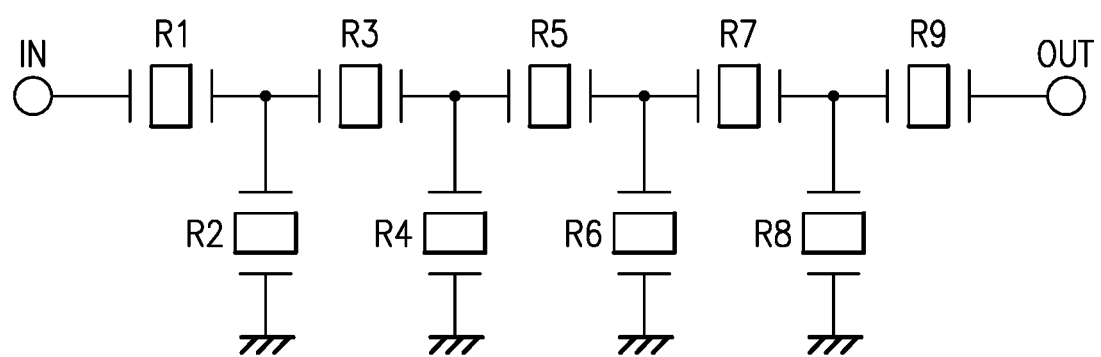
FIG. 12 is a schematic diagram of a radio frequency ladder filter.

In some embodiments, multiple SAW resonators as disclosed herein may be combined into a filter, for example, an RF ladder filter schematically illustrated in FIG. 12 and including a plurality of series resonators R1, R3, R5, R7, and R9, and a plurality of parallel resonators R2, R4, R6, and R8. Other filter structures and other circuit structures known in the art that may include SAW devices or resonators, for example, duplexers, baluns, etc., may also be formed including examples of SAW resonators as disclosed herein.

Figure 13:
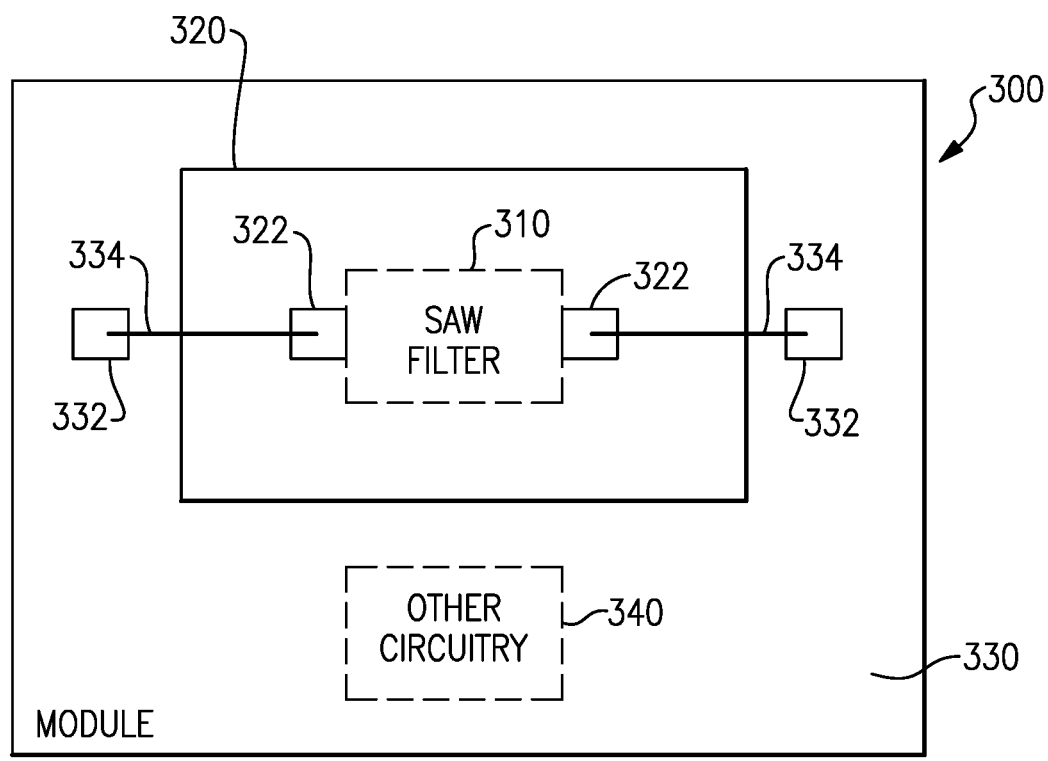
FIG. 13 is a block diagram of one example of a filter module that can include one or more surface acoustic wave resonators according to aspects of the present disclosure.
Figure 14:
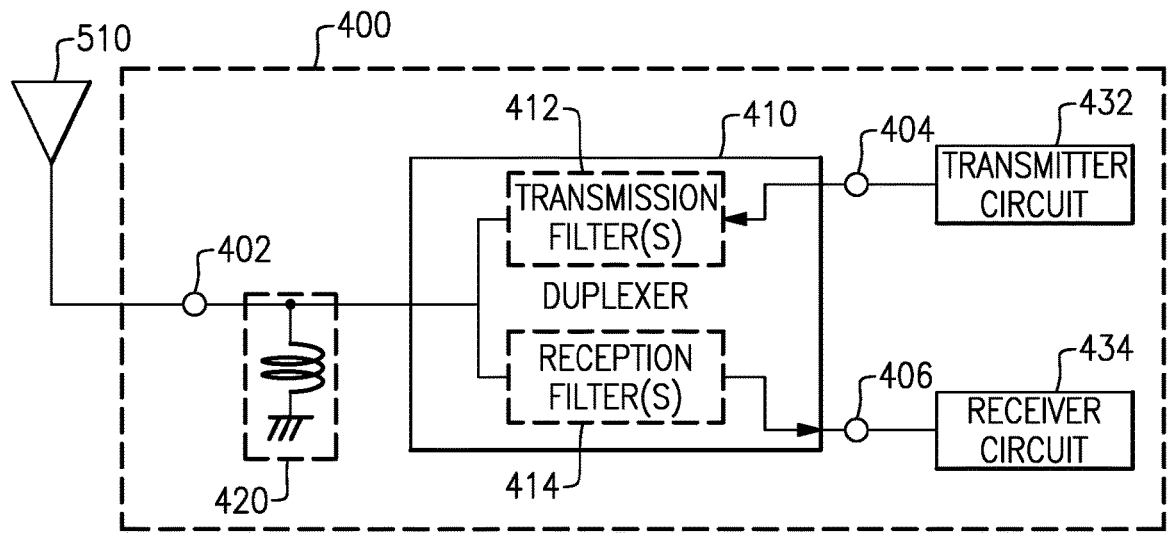
FIG. 14 is a block diagram of one example of a front-end module that can include one or more filter modules according to aspects of the present disclosure.

The acoustic wave resonators discussed herein can be implemented in a variety of packaged modules. Some example packaged modules will now be discussed in which any suitable principles and advantages of the packaged acoustic wave resonators discussed herein can be implemented. FIGS. 12, 13, and 14 are schematic block diagrams of illustrative packaged modules and devices according to certain embodiments.

As discussed above, embodiments of the surface acoustic wave elements can be configured as or used in filters, for example. In turn, a surface acoustic wave (SAW) filter using one or more surface acoustic wave elements may be incorporated into and packaged as a module that may ultimately be used in an electronic device, such as a wireless communications device, for example. FIG. 13 is a block diagram illustrating one example of a module 300 including a SAW filter 310. The SAW filter 310 may be implemented on one or more die(s) 320 including one or more connection pads 322. For example, the SAW filter 310 may include a connection pad 322 that corresponds to an input contact for the SAW filter and another connection pad 322 that corresponds to an output contact for the SAW filter. The packaged module 300 includes a packaging substrate 330 that is configured to receive a plurality of components, including the die 320. A plurality of connection pads 332 can be disposed on the packaging substrate 330, and the various connection pads 322 of the SAW filter die 320 can be connected to the connection pads 332 on the packaging substrate 330 via electrical connectors 334, which can be solder bumps or wirebonds, for example, to allow for passing of various signals to and from the SAW filter 310. The module 300 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 300 can also include one or more packaging structures to, for example, provide protection and facilitate easier handling of the module 300. Such a packaging structure can include an overmold formed over the packaging substrate 330 and dimensioned to substantially encapsulate the various circuits and components thereon.

Various examples and embodiments of the SAW filter 310 can be used in a wide variety of electronic devices. For example, the SAW filter 310 can be used in an antenna duplexer, which itself can be incorporated into a variety of electronic devices, such as RF front-end modules and communication devices.

Referring to FIG. 14, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 310 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 14, however in other embodiments these components may be integrated into a common transceiver circuit or module. As will be appreciated by those skilled in the art, the front-end module 400 may include other components that are not illustrated in FIG. 14 including, but not limited to, switches, electromagnetic couplers, amplifiers, processors, and the like.

Figure 15:
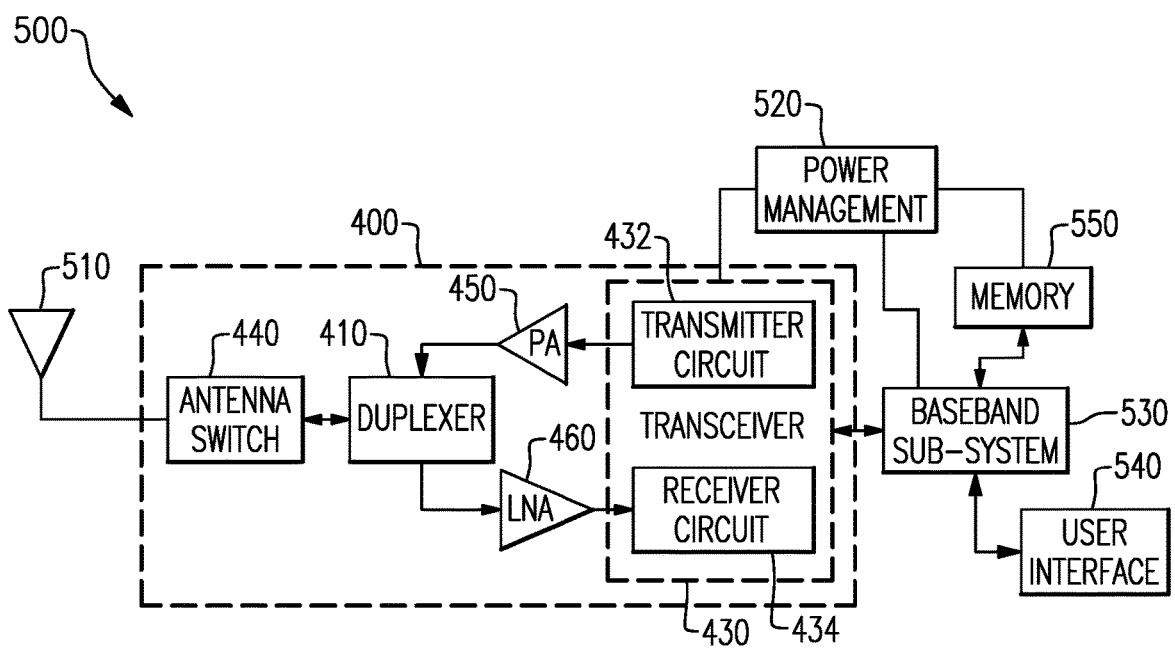
FIG. 15 is a block diagram of one example of a wireless device including the front-end module of FIG. 14.

FIG. 15 is a block diagram of one example of a wireless device 500 including the antenna duplexer 410 shown in FIG. 14. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 14. The front-end module 400 includes the duplexer 410, as discussed above. In the example shown in FIG. 15 the front-end module 400 further includes an antenna switch 440, which can be configured to switch between different frequency bands or modes, such as transmit and receive modes, for example. In the example illustrated in FIG. 15, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 14.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 15, the front-end module 400 may further include a low noise amplifier module 460, which amplifies received signals from the antenna 510 and provides the amplified signals to the receiver circuit 434 of the transceiver 430.

The wireless device 500 of FIG. 15 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Example 1

Figure 9:
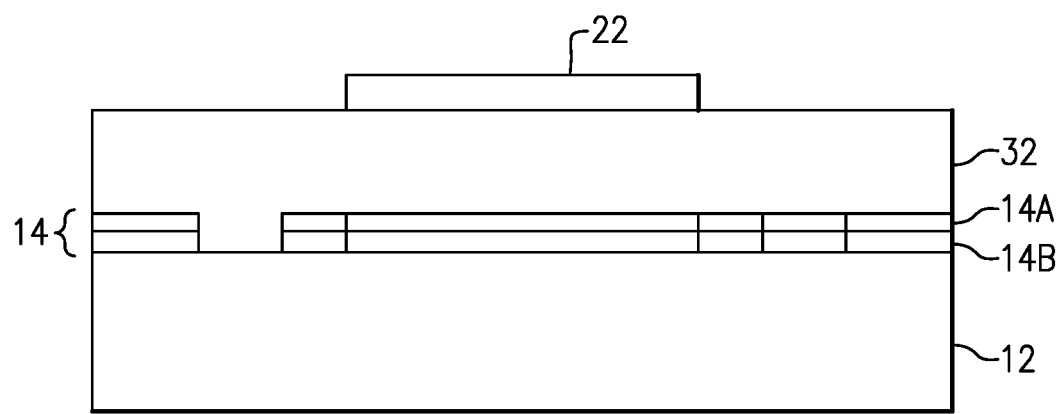
FIG. 9 is a cross-sectional view of a portion of electrodes of a SAW resonator including a dielectric material layer for suppressing transverse mode spurious signals.

The performance of a SAW resonator including stacked dielectric layers of silicon nitride and silicon dioxide as illustrated in FIGS. 2A and 2B (a "SiN Trench" device) was compared to that of a SAW resonator including gap hammer and edge hammer structures (a "Gap Hammer" device) as illustrated in FIGS. 6 and 9. Parameters of the devices are listed in the table below:

| | Label | Unit | SiN Trench | Gap Hammer |
|---|---|---|---|---|
| LN Cut Angle | Ang | deg. | 118 | 118 |
| Lambda | L | um | 4.2 | 4.2 |
| Aperture (distance between edge regions) | Ap | λ | 25 | 25 |
| Center Duty Factor | DFc | — | 0.50 | 0.45 |
| Edge Duty Factor | DFe | — | 0.50 | 0.55 |
| Gap Duty Factor | DFg | — | 0.50 | 0.60 |
| W thickness | Wt | λ | 0.0785 | 0.0785 |
| Al thickness | Alt | λ | 0.0476 | 0.0476 |
| SiO2 thickness | SiO2t | λ | 0.39 | 0.39 |
| SiN thickness in center region | SiNt | λ | 0.0143 | 0.0036 |
| SiN etching outside of center region | SiNe | λ | 0.0129 | 0.0036 (no SiN layer outside center region) |
| Edge Hammer Length | Leh | λ | NA | 0.75 |
| SiN Edge Length | Les | λ | 1.0 | Leh |
| Gap Length | Lg | λ | 1.5 | 1.5 |
| Gap1 L | Lg1 | λ | NA | 0.15 |
| Gap Hammer Length | Lgh | λ | NA | 0.15 |

Figure 16A:
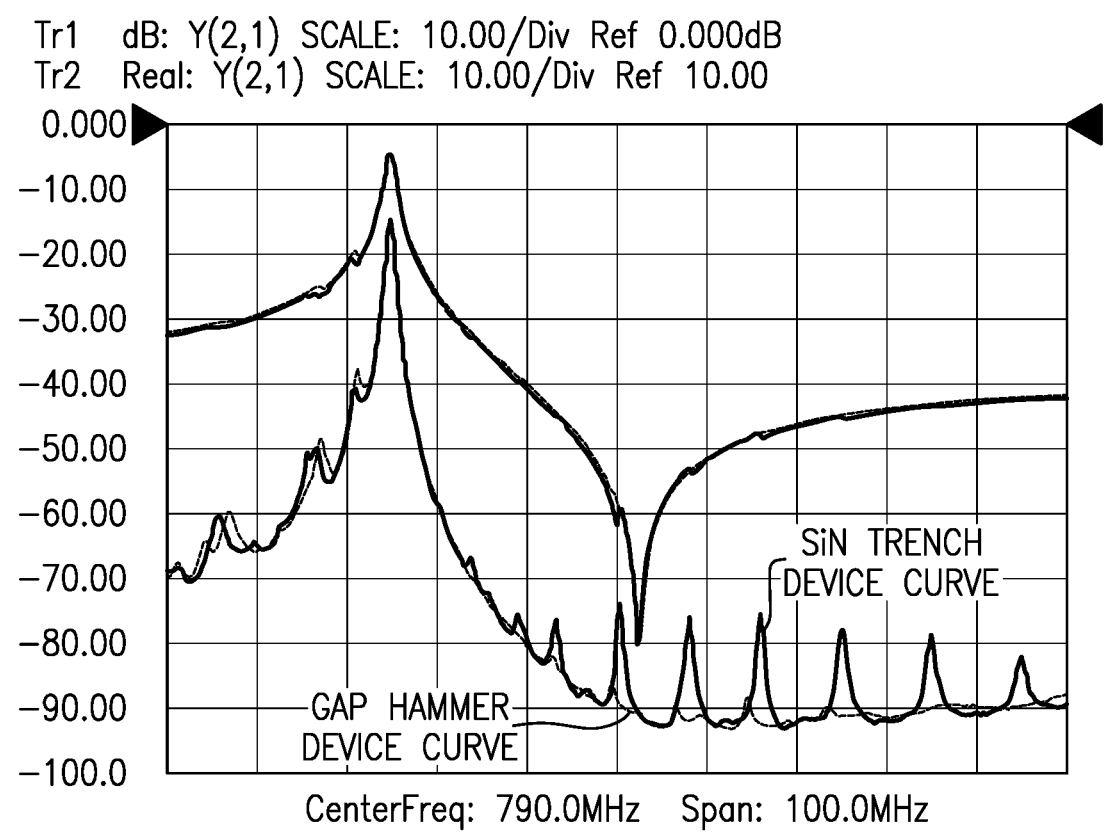
FIG. 16A illustrates a comparison between admittance curves of a SAW resonator including a silicon nitride trench structure and a SAW resonator including a gap hammer structure.
Figure 16B:
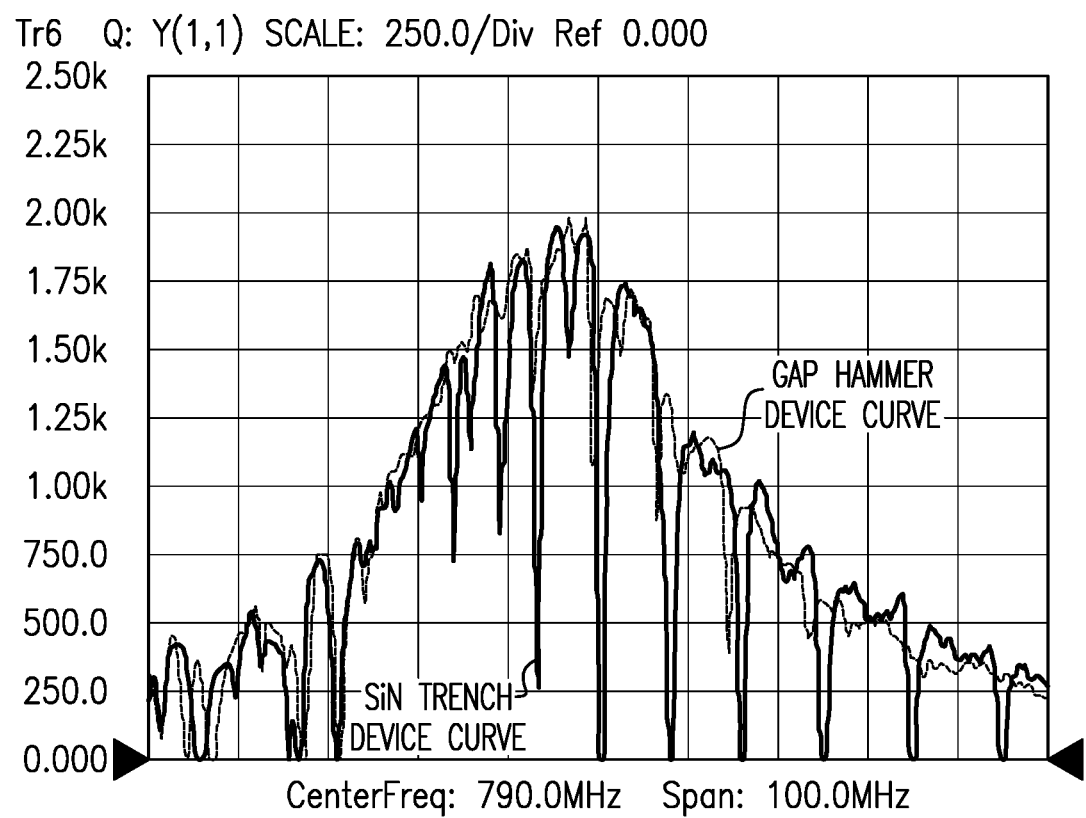
FIG. 16B illustrates a comparison between quality factor curves of a SAW resonator including a silicon nitride trench structure and a SAW resonator including a gap hammer structure.

The results of the comparison are shown in FIGS. 16A and 16B. As shown in FIG. 16A, the SiN Trench device exhibited significant transverse mode spurious signals in the real admittance of the device, especially around and above the antiresonance frequency of the device. These signals were effectively suppressed in the Gap Hammer device. The transverse mode spurious signals above the antiresonance frequency of the Gap Hammer device were barely perceptible and less than about 10 db as compared to the transverse mode spurious signals exhibited by the SiN Trench device. With respect to FIG. 16B, the SiN Trench device exhibited significant discontinuities and drops in quality factor Q at multiple frequencies. The degree of the drop in Q at various frequencies was significantly smaller in the Gap Hammer device than in the SiN Trench device, in some instance by about 1000 near the center frequency of the device.

Example 2

Figure 17A:
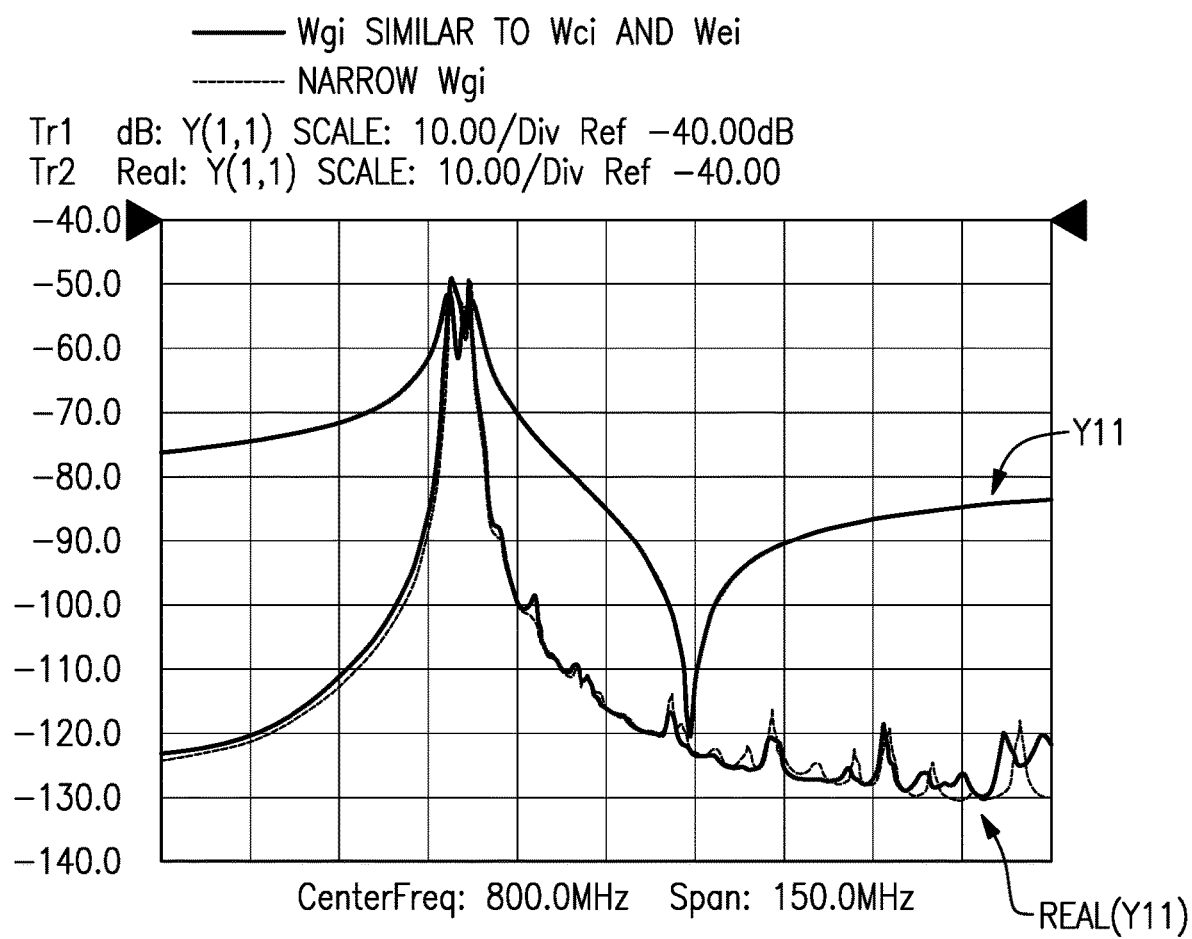
FIG. 17A illustrates a comparison between admittance curves of a SAW resonator including IDT electrodes with a gap hammer structure and similar widths in the gap, center, and edge regions and a SAW resonator with a gap hammer structure and IDT electrodes that are narrower in the gap regions than in the center and edge regions.
Figure 17B:
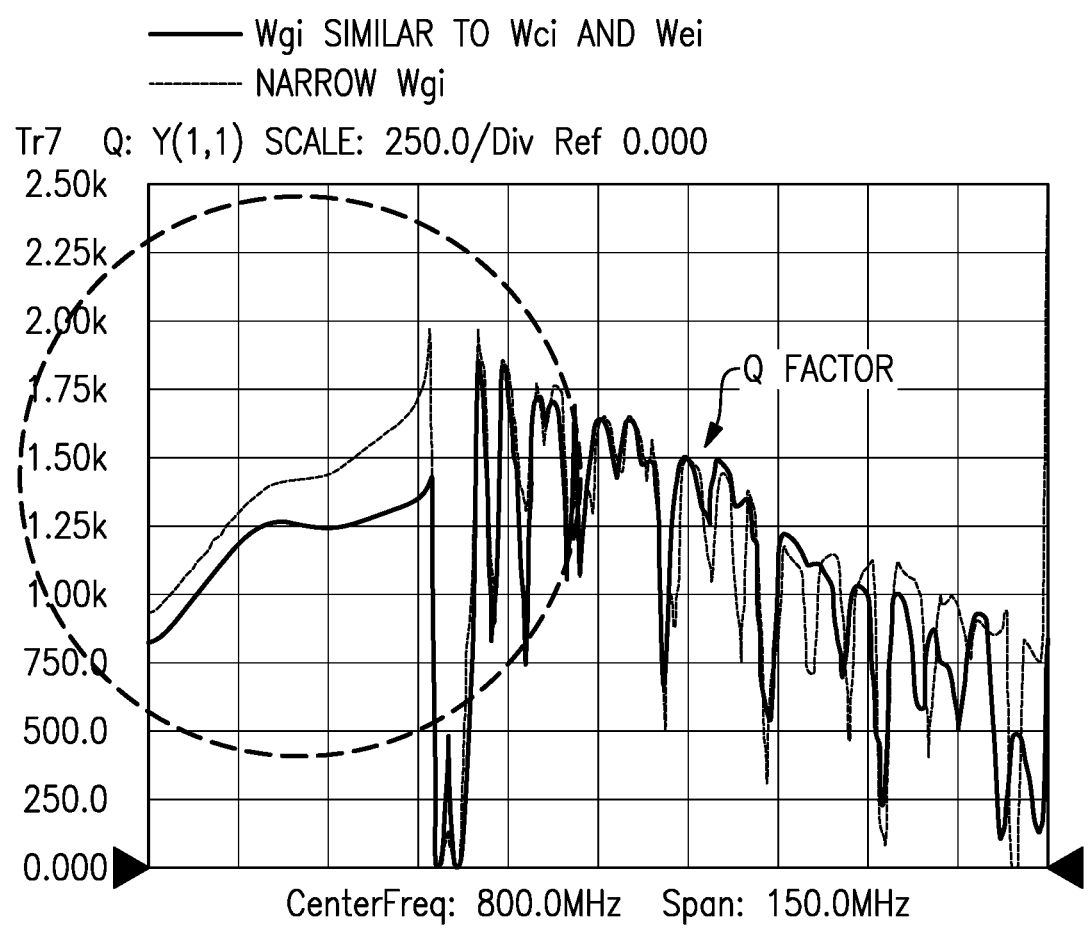
FIG. 17B illustrates a comparison between quality factor curves of a SAW resonator including IDT electrodes with a gap hammer structure and similar widths in the gap, center, and edge regions and a SAW resonator with a gap hammer structure and IDT electrodes that are narrower in the gap regions than in the center and edge regions.

The performance of a SAW resonator including gap hammer and edge hammer structures (a "Gap Hammer" device) as illustrated in FIGS. 6 and 9 was compared to that of a similar device but having narrow gap IDT electrodes as illustrated in FIG. 8. The admittance curves of the two devices is illustrated in FIG. 17A. The quality factor curves of the two devices is illustrated in FIG. 17B. It can be seen from FIGS. 17A and 17B that the quality factor of the SAW resonator having the narrow gap IDT electrodes was improved as compared to the SAW device having similar IDT electrode widths in the gap, center, and edge regions, especially in the circled region of FIG. 17B. The transverse mode spurious mode signals for the SAW resonator having the narrow gap IDT electrodes was slightly elevated at frequencies above the anti-resonance frequency of the resonators as compared to the SAW device having similar IDT electrode widths in the gap, center, and edge regions.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a substrate including a piezoelectric material;
interdigital transducer (IDT) electrodes disposed on a surface of the substrate, the IDT electrodes including a first bus bar, a second bus bar opposite the first bus bar, and electrode fingers including a first plurality of electrode fingers extending from the first bus bar and a second plurality of electrode fingers extending from the second bus bar and interleaved with the first plurality of electrode fingers, the IDT electrodes having gap regions, edge regions, center regions, and extending regions defined in the gap regions from tips of each electrode finger to an opposing bus bar, edges of the extending regions aligned with edges of the corresponding electrode fingers from which they extend, a maximum width of the IDT electrodes in the gap regions being greater than the maximum width of the IDT electrodes in the edge regions to cause a velocity of an acoustic wave in the gap regions to be greater than the velocity of the acoustic wave in the center regions, and the velocity of the acoustic wave in the center regions to be greater than the velocity of the acoustic wave in the edge regions; and
IDT electrode extensions extending from the IDT electrode fingers in a widthwise direction from the IDT electrode fingers in the gap regions, the IDT electrode extensions of the first plurality of electrode fingers extending at least partially into the extending regions of the second plurality of electrode fingers, gaps being defined between the IDT electrode extensions of each of the first plurality of electrode fingers and each other of the first plurality of electrode fingers.

2. The acoustic wave device of claim 1 wherein an average width of the IDT electrodes in the gap region is greater than the average width of the IDT electrodes in the edge regions and greater than the average width of the IDT electrodes in the center regions.

3. The acoustic wave device of claim 2 wherein the IDT electrode extensions extend fully into extending regions of the IDT electrodes adjacent to the IDT electrodes from which the IDT electrode extensions extend.

4. The acoustic wave device of claim 2 wherein the IDT electrode extensions extend beyond extending regions of the IDT electrodes adjacent to the IDT electrodes from which the IDT electrode extensions extend.

5. The acoustic wave device of claim 2 wherein a distance between the IDT electrode extensions and tips of IDT electrodes adjacent to the IDT electrodes from which the IDT electrode extensions extend is less than widths of the IDT electrodes in the edge regions and in the center regions.

6. The acoustic wave device of claim 2 wherein widths of the IDT electrode extensions in a direction perpendicular to a propagation direction of a main acoustic wave through the device is less than widths of the IDT electrodes in the edge regions and in the center regions.

7. The acoustic wave device of claim 1 wherein each of a plurality of the IDT electrodes includes a portion in an outer side of one of the gap regions that has a central axis that is offset in a direction parallel to a propagation direction of a main acoustic wave through the resonator from a central axis of a portion of the IDT electrode in an inner side of the one of the gap regions.

8. The acoustic wave resonator of claim 7 wherein the central axis of the portions of each of the plurality of the IDT electrodes in the outer side of the one of the gap regions is offset in the direction parallel to the propagation direction of the main acoustic wave through the resonator from central axes of portions of the IDT electrodes in a center region of the resonator.

9. The acoustic wave resonator of claim 7 wherein the central axis of the portion of each of the plurality of the IDT electrodes in the outer side of the one of the gap regions is offset in the direction parallel to the propagation direction of the main acoustic wave through the resonator from a central axis of an adjacent IDT electrode.

10. The acoustic wave device of claim 1 wherein widths of portions of the IDT electrodes in the gap regions are greater than widths of the IDT electrodes in the edge regions.

11. The acoustic wave device of claim 1 wherein widths of portions of the IDT electrodes in the gap regions are less than widths of the IDT electrodes in the edge regions.

12. The acoustic wave device of claim 1 wherein widths of portions of the IDT electrodes in the gap regions are greater than widths of the IDT electrodes in the center regions.

13. The acoustic wave device of claim 1 wherein widths of portions of the IDT electrodes in the gap regions are less than widths of the IDT electrodes in the center regions.

14. The acoustic wave device of claim 1 wherein widths of the IDT electrodes in the edge regions are greater than widths of the IDT electrodes in the center regions.

15. The acoustic wave device of claim 1 further comprising a first dielectric film having a lower surface disposed on the IDT electrodes and the surface of the substrate and a second dielectric film having an acoustic velocity greater than an acoustic velocity of the first dielectric film disposed on an upper surface of the first dielectric film, the second dielectric film having a thickness in the center regions that is greater than the thickness of the second dielectric film in the edge regions and in the gap regions.

16. The acoustic wave device of claim 1 further comprising a first dielectric film having a lower surface disposed on the IDT electrodes and the surface of the substrate and a second dielectric film having an acoustic velocity greater than an acoustic velocity of the first dielectric film disposed on an upper surface of the first dielectric film, the second dielectric film having a thickness in the center regions and in first portions of the edge regions that is greater than the thickness of the second dielectric film in second portions of the edge regions and in the gap regions.

17. A radio frequency filter including at least one acoustic wave device, the at least one acoustic wave device comprising:
a substrate including a piezoelectric material;
interdigital transducer (IDT) electrodes disposed on a surface of the substrate, the IDT electrodes including a first bus bar, a second bus bar opposite the first bus bar, and electrode fingers including a first plurality of electrode fingers extending from the first bus bar and a second plurality of electrode fingers extending from the second bus bar and interleaved with the first plurality of electrode fingers, the IDT electrodes having gap regions, edge regions, center regions, and extending regions defined in the gap regions from tips of each electrode finger to an opposing bus bar, edges of the extending regions aligned with edges of the corresponding electrode fingers from which they extend, a velocity of an acoustic wave in the gap regions being greater than the velocity of the acoustic wave in the center regions, the velocity of the acoustic wave in the center regions being greater than the velocity of the acoustic wave in the edge regions; and IDT electrode extensions extending from the IDT electrode fingers in a widthwise direction from the IDT electrode fingers in the gap regions, the IDT electrode extensions of the first plurality of electrode fingers extending at least partially into the extending regions of the second plurality of electrode fingers, gaps being defined between the IDT electrode extensions of each of the first plurality of electrode fingers and each other of the first plurality of electrode fingers.

18. An electronics module including at least one radio frequency filter including at least one acoustic wave device, the at least one acoustic wave device comprising:

a substrate including a piezoelectric material;

interdigital transducer (IDT) electrodes disposed on a surface of the substrate, the IDT electrodes including a first bus bar, a second bus bar opposite the first bus bar, and electrode fingers including a first plurality of electrode fingers extending from the first bus bar and a second plurality of electrode fingers extending from the second bus bar and interleaved with the first plurality of electrode fingers, the IDT electrodes having gap regions, edge regions, center regions, and extending regions defined in the gap regions from tips of each electrode finger to an opposing bus bar, edges of the extending regions aligned with edges of the corresponding electrode fingers from which they extend, a velocity of an acoustic wave in the gap regions being greater than the velocity of the acoustic wave in the center regions, the velocity of the acoustic wave in the center regions being greater than the velocity of the acoustic wave in the edge regions; and IDT electrode extensions extending from the IDT electrode fingers in a widthwise direction from the IDT electrode fingers in the gap regions, the IDT electrode extensions of the first plurality of electrode fingers extending at least partially into the extending regions of the second plurality of electrode fingers, gaps being defined between the IDT electrode extensions of each of the first plurality of electrode fingers and each other of the first plurality of electrode fingers.

* * * * *

UNITED STATES PATENT AND TRADEMARK OFFICE
CERTIFICATE OF CORRECTION

| | | |
|---|---|---|
| PATENT NO. | : 11,677,380 B2 | |
| APPLICATION NO. | : 17/001826 | |
| DATED | : June 13, 2023 | |
| INVENTOR(S) | : Joji Fujiwara et al. | |

It is certified that error appears in the above-identified patent and that said Letters Patent is hereby corrected as shown below:

On the Title Page

(72) Inventors: delete "Joji Fujiwara, Suita (JP); Riho Sasaki, Osaka-Fu (JP)" and insert
-- Joji Fujiwara, Suita-Shi (JP); Riho Sasaki, Osaka-Fu (JP) --

Signed and Sealed this
Eleventh Day of July, 2023

Katherine Kelly Vidal
*Director of the United States Patent and Trademark Office*